(12) United States Patent
Miller et al.

(10) Patent No.: US 7,142,179 B2
(45) Date of Patent: Nov. 28, 2006

(54) OLED DISPLAY DEVICE

(75) Inventors: Michael E. Miller, Honeoye Falls, NY (US); Ronald S. Cok, Rochester, NY (US); Andrew D. Arnold, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/087,522

(22) Filed: Mar. 23, 2005

(65) Prior Publication Data

US 2006/0214596 A1    Sep. 28, 2006

(51) Int. Cl.
*H05B 33/14* (2006.01)
(52) U.S. Cl. .................. 345/76; 315/169.3
(58) Field of Classification Search ............ None
See application file for complete search history.

(56) References Cited

U.S. PATENT DOCUMENTS

| | | | |
|---|---|---|---|
| 4,769,292 A * | 9/1988 | Tang et al. | |
| 5,294,869 A * | 3/1994 | Tang et al. | |
| 5,294,870 A * | 3/1994 | Tang et al. | 313/504 |
| 5,703,436 A * | 12/1997 | Forrest et al. | |
| 6,683,423 B1 * | 1/2004 | Cunningham | 315/312 |
| 2004/0113875 A1 * | 6/2004 | Miller et al. | |

OTHER PUBLICATIONS

"Electroluminescence Of Doped Organic Thin Films"; of C. W. Tang et al; Journal of Applied Physics; vol. 65; No. 9; May 1, 1989; pp. 3610-3616.*
"Organic Electroluminescent Diodes", of C. W. Tang et al; Applied Physics Letter; vol. 51; No. 12; Sep. 21, 1987; pp. 913-915.*
"Electroluminescence In Organic Films With Three-Layer Structure"; of Chihaya Adachi et al; Japanese Journal Of Applied Physics; vol. 27; No. 2; Feb. 1988; pp. L269-L271.*

* cited by examiner

*Primary Examiner*—David Vu
(74) *Attorney, Agent, or Firm*—Andrew J. Anderson

(57) ABSTRACT

A full-color OLED display device comprised of a substrate; an array of light-emitting elements, each element comprised of a first EL unit positioned between and in electrical contact with a first pair of electrodes and a second EL unit positioned between and in electrical contact with a second pair of electrodes and located above or below the first EL unit, wherein the first EL unit emits light primarily in only two of the red, green and blue portions of the visible spectrum, and the second EL unit emits light at least in the remaining third portion of the visible spectrum; and a component for selectively filtering the light produced by the first EL unit to filter light from one of the only two of the red, green and blue portions of the visible spectrum in some light-emitting elements and to filter light from the other of the only two of the red, green and blue portions of the visible spectrum in some other light-emitting elements.

30 Claims, 15 Drawing Sheets

OLED DISPLAY DEVICE

FIELD OF THE INVENTION

The present invention relates to the structure and manufacture of flat-panel, light-emitting displays and, more particularly, to OLED light-emitting devices capable of creating a full-color display from two, independently addressable, electroluminescent unit layers within the display structure.

BACKGROUND OF THE INVENTION

Light-emitting, flat-panel display devices are used for a number of applications such as general illumination light sources, decorative light sources, and information displays. Organic light-emitting diode (OLED) display devices often form an array of differently colored, light-emitting elements that are either arranged spatially on a single plane as discussed by U.S. Pat. No. 5,294,869 issued to Tang and Littman, entitled "Organic electroluminescent multicolor image display device" or are composed of a number of stacked, individually-addressable emissive layers as has been discussed by U.S. Pat. No. 5,703,436 issued to Forrest et al., entitled "Transparent Contacts for Organic Devices". To form large, high-resolution devices of either type presents significant manufacturing barriers.

The structure of an OLED typically comprises, in sequence, an anode, an organic electroluminescent (EL) medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic electroluminescent diodes", *Applied Physics Letters,* 51, 913 (1987), and U.S. Pat. No. 4,769,292, demonstrated highly efficient OLEDs using such a layer structure. Since then, numerous OLEDs with alternative layer structures have been disclosed. For example, there are three-layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics,* 27, L269 (1988), and by Tang et al., "Electroluminescence of doped organic thin films", *Journal of Applied Physics,* 65, 3610 (1989). The LEL commonly includes a host material doped with a guest material wherein the layer structures are denoted as HTL/LEL/ETL. Further, there are other multi-layer OLEDs that contain a hole-injecting layer (HIL), and/or an electron-injecting layer (EIL), and/or a hole-blocking layer, and/or an electron-blocking layer in the devices. These structures have further resulted in improved device performance. The term "EL unit" may be used to describe the layers between and in electrical contact with a pair of electrodes, and will include at least one light-emitting layer, and more typically comprises, in sequence, a hole-transport layer, a light-emitting layer, and an electron-transport layer, denoted in brief as HTL/LEL/ETL.

The formation of a full-color display device through the spatial arrangement of different colors of emissive organic materials on a single plane requires at least three different organic materials to be deposited in a mosaic on a single plane. This mosaic must be deposited such that any one of the organic materials does not overlap a second organic material and further that each organic material appropriately overlaps electrodes that are formed to drive the organic display. Methods such as vapor deposition through a shadow mask are often used to accomplish this task. Unfortunately, accurate alignment of shadow masks with the appropriate electrodes on the substrate requires a significant period of time to accomplish, slowing manufacturing. Of even greater concern is the fact that the shadow masks are typically not thermally stable and, therefore, it is difficult to maintain the exact tolerances necessary to correctly pattern the three-or-more colors of organic light-emitting materials onto a substrate. Further, the amount of thermal expansion that can occur with a shadow mask increases with increases in mask area, making this process very difficult, if not impossible, when forming OLED displays on large substrates. Other methods to pattern organic materials onto a substrate have been proposed and are a subject of research. However, only evaporation through a shadow mask has been successfully demonstrated in high-volume manufacturing.

To overcome this problem, a single organic emitter may be deposited on a single plane, this organic emitter providing either a broadband emission or multiple spectral peaks. Red, green and blue color filters may then be used to filter the emission from the single emitter to form red, green, and blue subpixels. While this method has the advantage that it allows a full-color display to be made without requiring patterning of the deposited organic material, the color filters must provide a narrow pass band to form a full-color display, significantly reducing the efficiency of the display. In such a display, it is typical that less than one third of the light that is produced by the organic emitter is passed through the color filters.

It is possible to use other color filter arrangements to improve the efficiency of an OLED with red, green and blue color filters. One particularly useful approach utilizes an unfiltered white subpixel in addition to the subpixels that are filtered using red, green, and blue color filters as described in US Patent Application US2004/0113875 assigned to Miller et al. and entitled "Color OLED display with improved power efficiency". Using this approach, it has been shown that the efficiency of the display device can be doubled when compared to the use of subpixels having red, green, and blue color filters. In this display configuration nearly two-thirds of the light that is produced by the organic emitter is passed through the color filters when displaying typical images. Unfortunately, the layout of the underlying circuitry required to drive a display employing a fourth subpixel in each pixel limits the resolution of the display device.

Alternatively to patterning multiple colors of emitters on a single plane, separately addressable layers of red, green and blue emitters may be formed in a passive-matrix stacked OLED display structure as described by U.S. Pat. No. 5,703,436 issued to Forrest et al., entitled "Transparent Contacts for Organic Devices". A display device of this type is created by forming multiple, alternating layers of organic light-emitting material and materials that are used to form an electrode over a base electrode as shown in FIG. 1. Referring to FIG. 1, a display device of this type is formed by forming a first electrode 12 on a substrate 10. An EL unit 14 (comprised of one or more light-emitting organic material layers, and optionally additional material layers as further discussed below) is then formed over the first electrode, followed by a second electrode 16. Successive EL units 18 and 22 and electrodes 20 and 24 are then formed over this second electrode 16. To form a full-color device in this way requires the formation of at least three EL units 14, 18, and 22 and four electrodes 12, 16, 20, and 24. This method has the advantage that it does not, necessarily; require the organic materials to be spatially patterned. That is, if three independently addressable layers of light-emitting material can be formed, one emitting red light, a second emitting green light, and a third emitting blue light, then a full-color display may be formed without spatially patterning the EL materials. The display device can also theoretically be higher in resolution since the red, green, and blue subpixels are formed in the same spatial location.

Unfortunately, a robust manufacturing process for forming display devices of this type has not been demonstrated and active-matrix structures for forming such displays have not been disclosed. Issues such as the need to connect four stacked electrodes to circuitry on a substrate; the lack of electrode materials that are substantially transparent and have a high enough work function to serve as a cathode; and the need for TFT structures that can be used and connected to the four separate electrodes all prohibit the robust manufacturing of devices having three or more stacks.

There is a need, therefore, for an OLED device structure that avoids the need for patterning different OLED materials, has a high efficiency, has the capability for forming a high resolution display device, and that is simpler to construct than the three-or-more layer stacked display device.

SUMMARY OF THE INVENTION

The need is met by constructing a full-color OLED display device comprising a substrate; an array of light-emitting elements, each element comprising a first EL unit positioned between and in electrical contact with a first pair of electrodes and a second EL unit positioned between and in electrical contact with a second pair of electrodes and located above or below the first EL unit, wherein the first EL unit emits light primarily in only two of the red, green, and blue portions of the visible spectrum, and the second EL unit emits light at least in the remaining third portion of the visible spectrum; and a means for selectively filtering the light produced by the first EL unit to filter light from one of the only two of the red, green and blue portions of the visible spectrum in some light-emitting elements and to filter light from the other of the only two of the red, green and blue portions of the visible spectrum in some other light-emitting elements.

DETAILED DESCRIPTION OF THE INVENTION

Figure 1:
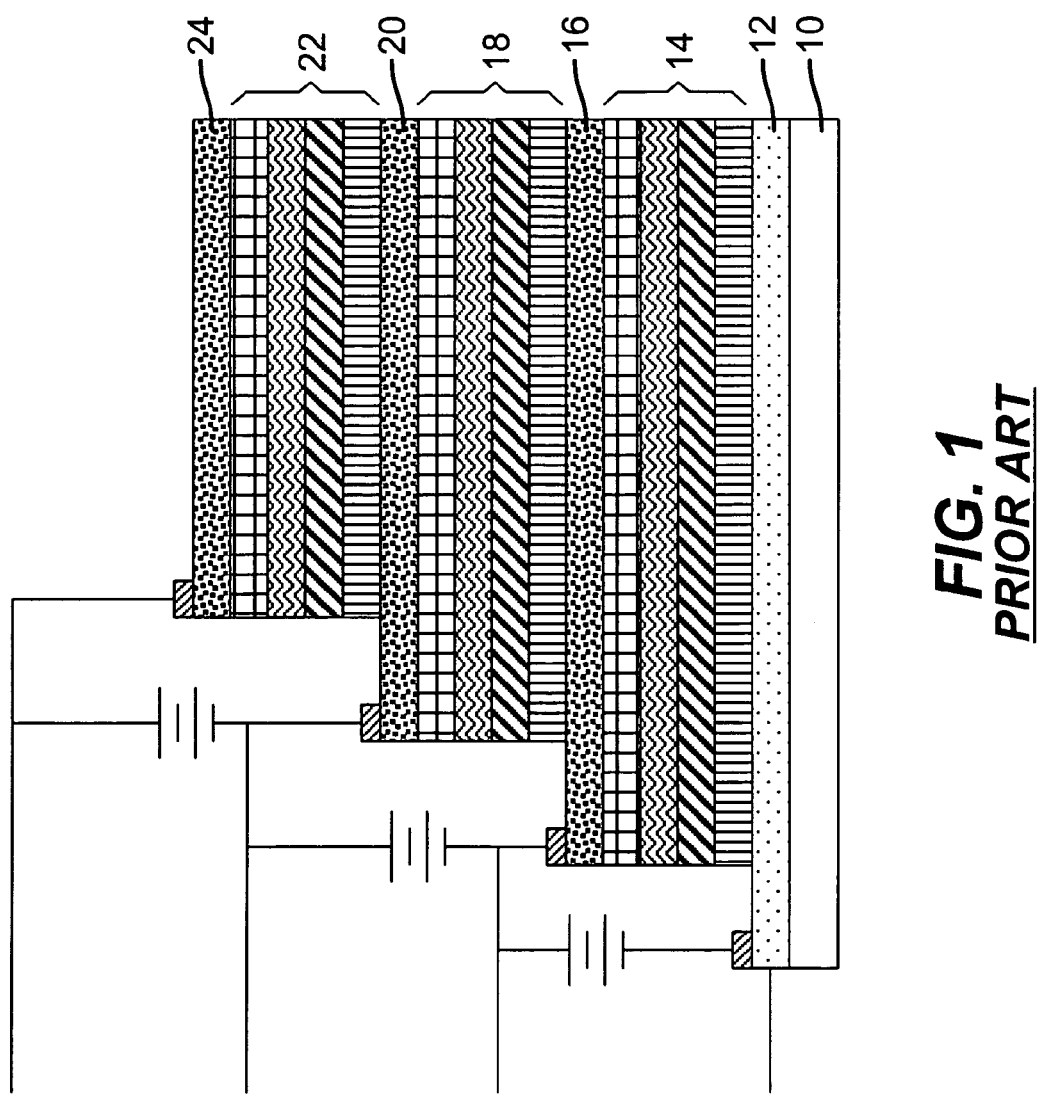
FIG. 1 is a diagram showing a longitudinal cross section of a prior-art device configuration.

The present invention provides an OLED device structure that avoids the need for spatially patterning different EL materials, has a high efficiency, has the capability for forming a high-resolution display device and is simpler to construct than the three-or-more layer stacked display device that has been disclosed in the prior art. This full-color OLED display device comprises a substrate; an array of light-emitting elements, each element comprised of a first EL unit positioned between and in electrical contact with a first pair of electrodes and a second EL unit positioned between and in electrical contact with a second pair electrodes and located above or below the first EL unit, wherein the first EL unit emits light primarily in only two of the red, green and blue portions of the visible spectrum, and the second EL unit emits light at least in the remaining third portion of the visible spectrum; and a means for selectively filtering the light produced by the first EL unit to filter light from one of the only two of the red, green and blue portions of the visible spectrum in some light-emitting elements and to filter light from the other of the only two of the red, green and blue portions of the visible spectrum in some other light-emitting elements. Within the context of the invention, the first EL unit will be considered to emit light primarily in only two of the red, green and blue portions of the visible spectrum when each of the integrated radiance values in each of the two portions are at least 20 percent (preferably at least 30, and more preferably at least 40 percent) of the total integrated radiance emitted by the first EL unit in the visible spectrum, and the integrated radiance value in the third portion is less than 20 percent (preferably less than 10 percent) of the total integrated radiance emitted by the first EL unit in the visible spectrum. The second EL unit preferably emits a greater percentage of light in the remaining third portion than in at least one of the only two portions of the visible spectrum in which the first EL unit primarily emits light, and more preferably at least 20 percent more (more preferably at least 40, and most preferably at least 60 percent more) of the total integrated radiance emitted by the second EL unit in the visible spectrum is in the third portion. Within this configuration, the first EL unit may provide a broadband emitter emitting light over two of the portions of the visible spectrum, but ideally provides an emitter having two distinct energy peaks within the visible spectrum, each of the peaks being positioned in separate red, green, and blue portions of the visible spectrum. The color filtering means then allows only the energy from one of the peaks to be emitted from a portion of the light-emitting elements while allowing only the energy from the second of the two peaks to be emitted by a second portion of the light-emitting elements.

It should be recognized that the human visual system is generally sensitive to energy in the electromagnetic spectrum between about 380 and 780 nm. For the purpose of this disclosure, this portion of the electromagnetic spectrum will be referred to as the visual spectrum. Further within this disclosure, the blue portion of the visible spectrum will defined as the portion having wavelengths between 380 and 490 nm, the green portion of the visible spectrum will be defined as the portion having wavelengths between 490 and 575 nm and the red portion of the visible spectrum will include the portion having wavelengths between 575 and 700 nm.

Since each of the light-emitting elements in the current invention are formed from a combination of the same two EL units, there is no need to pattern EL materials during manufacturing of such a display device, avoiding the manufacturing issues associated with this process step. The use of two EL units between two pairs of electrodes, instead of three, simplifies connectivity of the electrodes within the display device, as well as, reduces the number of manufacturing steps and manufacturing complexity. Providing two EL units between two pairs of electrodes may further increase the perceived resolution of the display device as compared to a single-unit device. Further, the fact that the EL units may be activated independently allows the use of broadband color filters which improves light extraction from the display device, and therefore, improves the display efficiency as compared to OLED displays formed from a single broadband emitter with three narrow band color filters.

Figure 2:
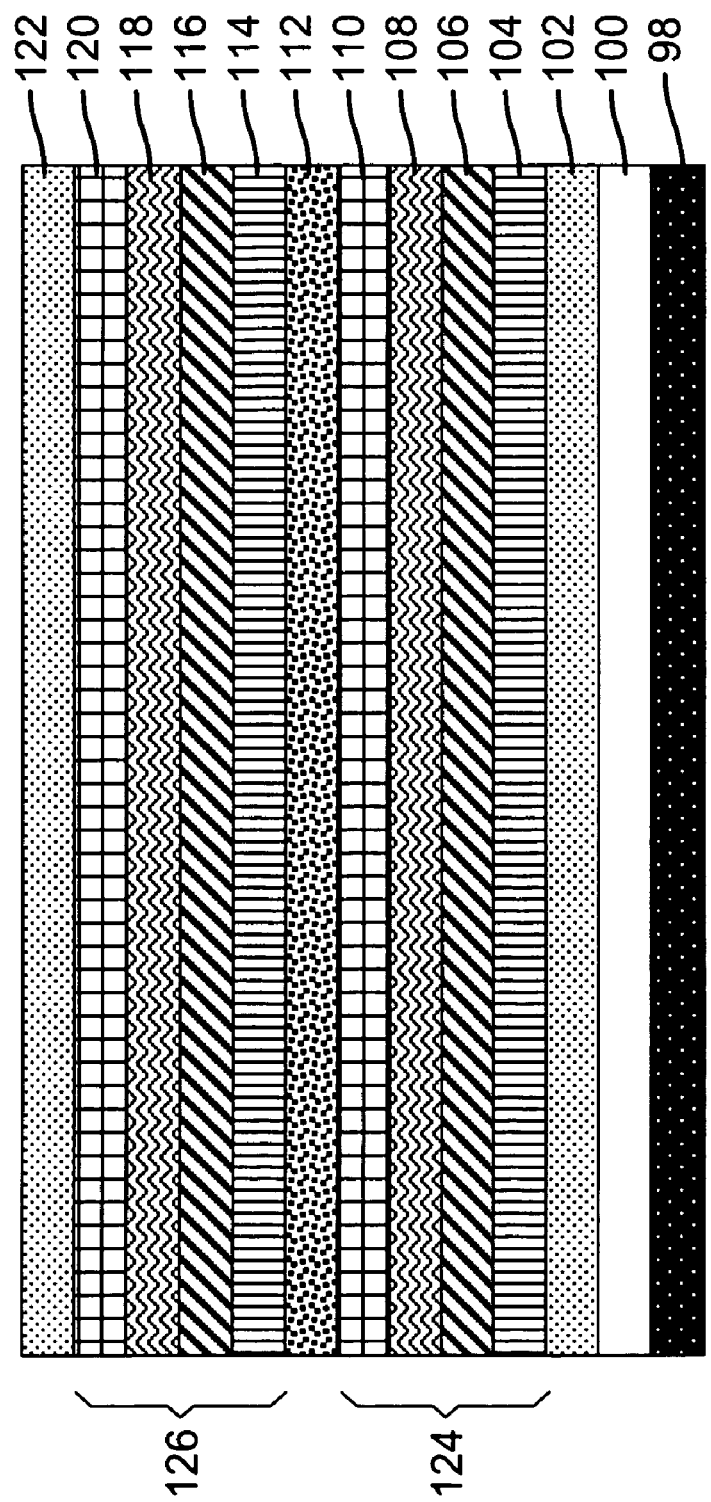
FIG. 2 is a diagram showing a longitudinal cross section of an OLED device of the present invention.

The present invention can be employed in several OLED device configurations. These include simple structures that may comprise at least three electrode layers forming the first and second pairs of electrodes, such as passive matrix-displays comprised of orthogonal arrays of patterned electrode layers to form pixels, and active-matrix displays where each pixel is controlled independently, for example, with a thin-film transistor (TFT). There are numerous configurations of the EL units wherein the present invention can be successfully practiced. A typical structure of an embodiment of the present invention is shown in FIG. 2 and is comprised of a substrate 98, a color filter 100, a first electrode 102, a first optional hole-injecting layer 104, a first hole-transporting layer 106, a first light-emitting layer 108, a first electron-transporting layer 110, a second electrode 112, a second optional hole-injecting layer 114, a second hole-transporting layer 116, a second light-emitting layer 118, a second electron-transporting layer 120 and a third electrode 122. In such embodiment, electrodes 102 and 112 constitute a first pair of electrodes, and layers 104, 106, 108, 110 constitute a first EL unit positioned between and in electrical contact with such first pair of electrodes. Similarly, electrodes 112 and 122 constitute a second pair of electrodes, and layers 114, 116, 118, 120 constitute a second EL unit positioned between and in electrical contact with such second pair of electrodes. These layers are described in detail below. The substrate may alternatively be located adjacent to the third electrode, or the substrate may actually constitute the first or third electrodes. To simplify the discussion of the particularly illustrated embodiment, the EL unit comprising a combination of the first optional hole-injecting layer 104, the first hole-transporting layer 106, the first light-emitting layer 108, and the first electron-transporting layer 110 will be referred to as the bottom EL unit 124, and the EL unit comprising a combination of the second optional hole-injecting layer 114, the second hole-transporting layer 116, the second light-emitting layer 118, and the second electron-transporting layer 120 will be referred to as the top EL unit 126. The total combined thickness of the organic layers within each EL unit is preferably less than 500 nm.

In a preferred embodiment of this device structure, each of the three electrodes will be independently addressable, allowing simultaneous, independent control of the two EL units. However, it should be recognized that simultaneous, independent control of the two EL units is not necessary and that other device structures that enable time-sequential, independent control of the two EL units may also be useful in practicing this invention.

To provide simultaneous, independent control of the two EL units, it must be possible to simultaneously and independently provide a positive bias across each EL unit. Within a preferred bottom-emitting embodiment, this will be accomplished by allowing the second electrode 112 to provide a reference voltage while a positive electrical potential is created across the bottom EL 124 unit by increasing the voltage to the first electrode 102 with respect to the reference voltage of the second electrode 112 to create a positive voltage differential between the second electrode 112 and the first electrode 102. This voltage differential will create a positive electrical potential between the hole-injecting layer 104 and the electron transport layer 110 of the bottom EL unit 124. Simultaneously, an independent, positive electrical potential may be created across the top EL unit 126 by decreasing the voltage of the third electrode 122 with respect to the second electrode 112 to create a negative voltage differential between the third 122 and second electrode 112. This voltage differential will create a positive electrical potential between the hole-injecting layer 114 and the electron transport layer 120 of the top EL unit 126. Alternatively, the third electrode 122 may create a positive voltage differential between the third 122 and second electrode 112 similar to the positive voltage differential between the first 102 and second electrode 112 if the order of the layers in the top EL 126 is reversed. Such an arrangement may reduce the number of different voltages necessary to operate the OLED device.

Each of the layers of this device are further described for clarification.

Substrate

The OLED device of this invention is typically provided over a supporting substrate 98. The electrode nearest the substrate is conveniently referred to as the bottom electrode. The substrate can either be light-transmissive or opaque, depending on the intended direction of light emission. The light-transmissive property is desirable for viewing the EL emission through the substrate. Transparent glass or plastic is commonly employed in such cases. For applications where the EL emission is not viewed through the bottom electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course in these device configurations, the remaining electrodes must be semi-transparent or transparent.

Color Filters

Within this disclosure, we broadly define means for selectively filtering light to include any physical element or structure that either significantly quenches or amplifies energy within some wavelength band within the visible spectrum with respect to other wavelength bands within the visible spectrum. A significant quenching or amplification of energy within some wavelength bands within the visible spectrum will modify the perceived color of the light emitted by the display device to result in a CIE delta E(L*a*b*) color difference metric of more than 10 units. Selective color filtering means employed within this invention will typically comprise either transmissive color filters or will be created through the use of optical cavity effects using microcavities.

A transmissive color filter layer 100 may typically be applied in this invention by depositing a wavelength selective material over at least a portion of the supporting substrate 98. Generally, at least two different types of color filters having two independent spectral responses will be provided to enable this invention.

Various methods and types of transmissive color filters are well known in the art and may be applied to enable an embodiment of the present invention. These include, but are not limited to, dichroic color filters that may be applied to the substrate using well-known spin coating techniques and dye or pigmented based color filters that may be patterned onto a glass substrate using spin coating or other well known patterning means such as inkjet deposition.

Color filtering means may also be effectively formed by selectively creating different layer thicknesses of the organic layers of an EL unit, for instance the Hole Transporting Layer, in order to form optical cavities or microcavities. Microcavities are generally formed by controlling the location of the light emission between a reflective electrode and a semi-transparent electrode as disclosed in US2004/0140757 filed by Tyan et al. and entitled "Microcavity OLED devices" and US2004/0160172 filed by Tyan et al. and entitled "Tuned microcavity color OLED display". When microcavities are used to enable this invention, microcavities of two or more thicknesses must be formed in a single EL unit layer of the device to select the portion of a multi-peaked or broadband emitter that is quenched and/or amplified. This is typically accomplished by patterning different thicknesses of the Hole Transporting Layers within different light-emitting elements. While the deposition of different thicknesses requires that this element be patterned, only a single patterning step is required in order to create two different thicknesses. Further, only one material must be patterned, making alternate patterning approaches, such as laser thermal deposition of this material more feasible. In such a device, the position of the light emission (i.e., the light-emitting layer) of the EL unit between the reflective electrode and semi-transparent electrode will be different for some light-emitting elements than for other light-emitting elements to provide light emission that is spectrally tuned to a different narrow wavelength band for some light-emitting elements than for others.

It will also be noted that when applying microcavities within device architecture such as this wherein the two EL units are formed on top of one another, the formation of one EL unit within a microcavity may influence the performance of the remaining EL unit. That is, while a microcavity will generally amplify the energy emitted within a narrow wavelength band of an EL unit that is correctly positioned within the microcavity, the microcavity will generally quench light in the same narrow wavelength band that is injected into the microcavity from an external source. Within a stacked OLED, light from the EL unit that is outside the microcavity will generally enter the microcavity and reflect off of the reflective electrode that forms the microcavity. In such a stacked device, the light that enters the microcavity within the narrow wavelength band to which the microcavity is tuned will be quenched while the remaining light that enters the microcavity will be returned towards the front of the display device. Therefore, the emission from the EL unit within each light-emitting element that is outside the microcavity will be partially filtered by the microcavity and its emission will be reduced within the wavelength band to which the microcavity between the reflective electrode and semi-transparent electrode is tuned. However, by selecting the emission spectra for the EL unit that is outside the microcavity such that it has little or no energy emission within the wavelength band to which the microcavity is tuned, the final light output by the EL unit that is outside the microcavity will be virtually unaffected by the microcavity.

Electrodes

When EL emission is viewed through either the first 102 or the third 122 electrode, the electrode should be transparent or substantially transparent to the emission of interest. Generally, the remaining of the first 102 or third 122 electrodes will be reflective. The second electrode 112 will also be transparent or semi-transparent to the emission of interest.

For the electrodes that serve as an anode, common transparent anode materials may be used in this invention, including indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is not viewed through one of the electrodes, the transmissive characteristics of the electrode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater.

Desirable materials for the electrodes that serve as a cathode should have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through an electrode that serves as the cathode, the electrode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No.

5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Electrode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layers (HIL)

It is often useful to provide hole-injecting layers 104 and 114 between the first electrode 102 and the first hole-transporting layer 106 as well as between the second electrode 112 and the second hole-transporting layer 116. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layers (HTL)

The hole-transporting layers 106 and 116 contain at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:
1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layers (LEL)

As more fully described in U.S. Pat. Nos. 4,769,292 and 5,935,721, the light-emitting layers (LEL) 108 and 118 of the first and second EL units 124 and 126 include a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)]
CO-2: Magnesium bisoxine[alias, bis(8-quinolinolato)magnesium(II)]
CO-3: Bis[benzo{f}-8-quinolinolato]zinc(II)
CO-4: Bis(2-methyl-8-quinolinolato)aluminum(III)-μ-oxo-bis(2-methyl-8-quinolinolato)aluminum(III)
CO-5: Indium trisoxine[alias, tris(8-quinolinolato)indium]
CO-6: Aluminum tris(5-methyloxine)[alias, tris(5-methyl-8-quinolinolato) aluminum(III)]
CO-7: Lithium oxine[alias, (8-quinolinolato)lithium(I)]
CO-8: Gallium oxine[alias, tris(8-quinolinolato)gallium (III)]
CO-9: Zirconium oxine[alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Many dopants are known that produce light with a dominant peak at one wavelength within the visible spectrum. Often the devices of the present invention require an OLED structure that is capable of creating light that has dominant peaks at two separate wavelengths, the light from one peak being filtered to produce one primary color and the light from a second peak being filtered to produce a second primary color. Such a light-emitting layer may be formed using two or more light-emitting layers that are coated on top of another as discussed in co-pending, commonly assigned U.S. Ser. No. 10/990,865 filed Nov. 17, 2004, the disclosure of which is herein incorporated by reference. Each of these two light-emitting layers may include a first host material and a first light-emitting material. Placing two layers of light-emitting material, each layer capable of producing light with a different peak wavelength within the structure, allows a light-emitting layer to be formed that produces emission at two dominant wavelengths.

Electron-Transporting Layers (ETL)

Preferred thin film-forming materials for use in forming the electron-transporting layers 110 and 120 of the EL units of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 110 and 108, as well as layers 120 and 118 can optionally be collapsed into a single layer that serve the function of supporting both light emission and electron transport. These layers can be collapsed in both small-molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Tandem Structures

Although the embodiment depicted in FIG. 2 illustrates singlebottom 124 and top 126 EL units located between electrode pairs 102,112 and 112,122, respectively, one or both of these pairs of electrodes may have multiple EL units operating in tandem positioned there between as disclosed in US 2003/0170491 filed by Liao and Tang and entitled "Providing an organic electroluminescent device having stacked electroluminescent units" and US 2003/0189401 filed by Kido and Hayashi and entitled "Organic electroluminescent device". In such a tandem device, a plurality of light-emitting layers are provided between a pair of electrodes, thereby increasing the amount of light emitted at the cost of an increased driving voltage. Within these structures a connecting layer is often coated between successive layers of HIL, HTL, LEL, and ETL. Such a connecting layer may also be formed from a hole-transporting layer and an electron-transporting layer.

Having described each of the layers in detail, preferred embodiments may be further described.

Figure 3:
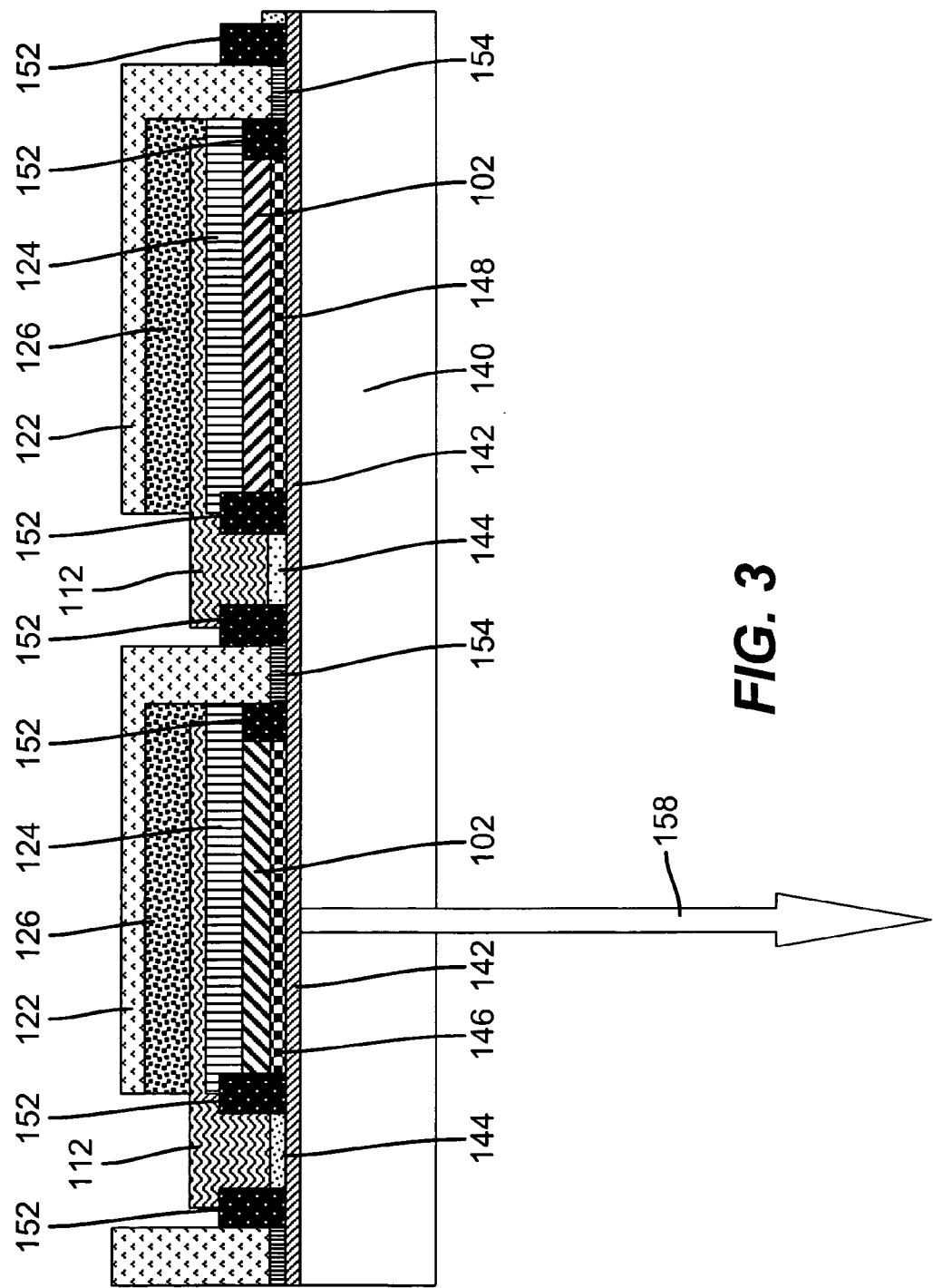
FIG. 3 is a longitudinal cross section of a bottom-emitting display device of the present invention.

A schematic cross section of a bottom-emitting, active-matrix embodiment of this invention is shown in FIG. 3. As shown in this figure, the active-matrix structure will typically be formed on a substrate 140. Light emission 158 will occur through this substrate. On this substrate, a drive circuitry layer 142 will be formed that contains thin-film transistors and other drive circuitry to drive the device as is known in the art. Over this drive circuitry, color filters 146 and 148 will be patterned, followed by the first electrode 102. Within this bottom-emitting configuration, this first electrode will preferably be transparent. A first connector 144 for the second 112 electrode will also be formed such that it is not in contact with the first 102 and third 122 electrode. A second connector 154, used to connect the third 122 electrode to the TFT layer, will also be formed. This connector 154 and the third electrode 122 will not be in electrical contact with the first 102 or second 112 electrodes. A planarization layer 152 will be patterned to electrically isolate the first connector 144 from both the first electrode 102 and the second connector 154. The bottom EL unit 124 will be formed over the first electrode 102 in such a way that a via will be provided to allow the second 112 and third 122 electrodes to be connected to the first 144 and second 154 connector, respectively. The second electrode 112 is then formed on top of the bottom EL unit 124 and surrounding area, such that it forms an electrical connection with the first connector 144. The top EL unit 126 is then formed over the second electrode 112. Finally the third electrode 122 is formed over the top EL unit 126 in such a way that it forms an electrical connection with the second connector 154.

It should be noted that many of the steps required in the manufacture of such a device are well known in the art. However, of special concern in the construction of such a device is the creation of vias between the second electrode 112 and its connector 144 as well as the vias between the third electrode 122 and its connector 154. While these may be formed in any number of ways, one method is to form the bottom EL unit 124 over the entire substrate. Vias are then formed to connect the second electrode 112 to its connector 144 using laser ablation as is known in the art. In the same step, laser ablation may also be used to remove EL materials, creating a via to connect the third electrode 122 to its connector 154. The second electrode 112 is then formed over the bottom EL unit 124, this deposition step allows the connection of the second electrode to its connector 144. Note, however, that this formation step will also connect the second 112 electrode to the connector 154 which is intended for the third electrode. Laser ablation is then used to remove a portion of the second electrode from around the area where the via for the third electrode is formed. This laser ablation step removes the electrical connection between the second electrode 112 and the connector 154 but leaves a connecting pad for the third electrode 122. The top EL unit 126 is then formed and laser ablation is again applied to create a via through the top EL unit 126 to the connecting pad for the third electrode. Finally, the third electrode 122 is formed. Other manufacturing steps may also be used to connect each of the top two electrodes to their connecting pads. A final step within the manufacturing step is to pattern the third electrode 122 for each subpixel. Again laser ablation may be applied to remove the material around each subpixel, placing them in electrical isolation. Other methods such as dry etching may also be applied within this step. Note that instead of coating the third electrode as a sheet, it is also possible to pattern this third electrode during the deposition step.

Figure 4:
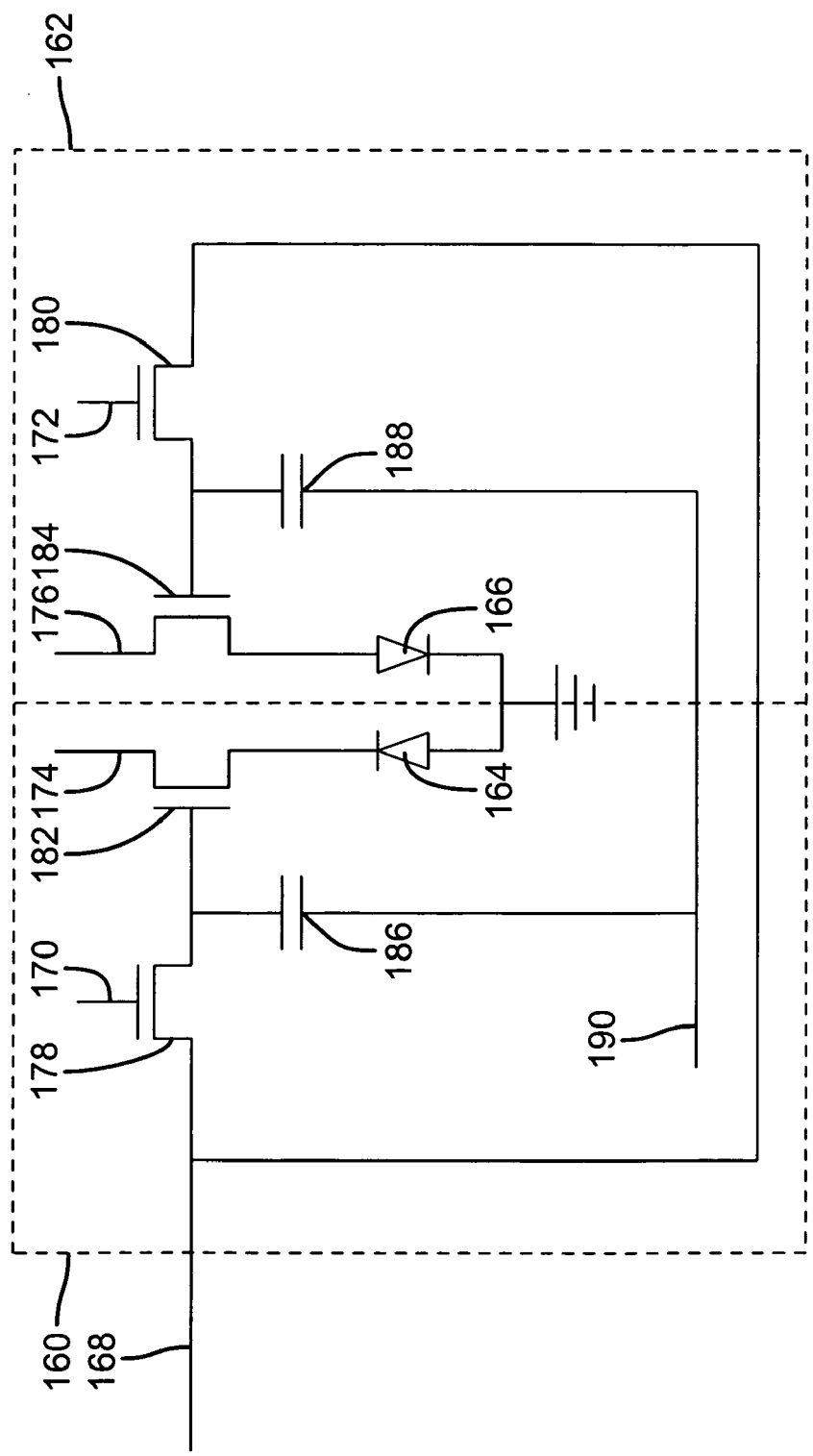
FIG. 4 is a diagram showing a circuit useful in driving a light-emitting element within the current invention.

The display device shown in FIG. 3 will employ an active matrix of thin-film transistors (TFTs) to drive the light-emitting elements. Although it is possible to simply provide two separate TFT circuits to drive each light-emitting element within the display device, it is possible to share drive and capacitor lines for each subpixel, providing some simplification of the panel layout. One such circuit useful in driving the display and that shares drive and capacitor lines is shown in FIG. 4. Utilizing this circuit a display device is formed in which the bottom 124 and top 126 EL units may each be separately controlled to independently drive the two EL units to selected illumination levels through the use of separate electrical potentials. As shown in this figure, the circuit to drive each light-emitting element may consist of two mirrored sub-circuits (160 and 162) wherein each sub-circuit is a circuit known in the art as being useful in driving an active-matrix OLED display. The first sub-circuit 160 is used to drive the diode 164 formed from the bottom EL unit 124. The second sub-circuit 162 is used to drive the diode 166 formed from the top EL unit 126. It will be recognized by one skilled in the art that each sub-circuit is a known circuit useful for driving a traditional single-layer OLED and as such, other commonly known circuits, such as those employing current mirrors or other enhancements, may be mirrored and utilized as a sub-circuit in a similar way to drive a light-emitting element of the current embodiment.

Within this circuit, the two, mirrored sub-circuits (160 and 162) share an input data line 168. Either the first 164 or second 166 diode may be selected through activating the first 170 or second 172 select line. Power with a positive potential is provided by the first power line 174 while power with a negative potential is provided by the second power line 176. A voltage is provided on the data line 168, which provides a drive voltage for either the first 164 or second 166 diode. To operate the circuit, a voltage signal is applied to the first select line 170 that turns on the first transistor 178. The light output level for the bottom EL unit is controlled by a voltage signal, which has been set on the data line 168. The first storage capacitor 186 is then charged to the voltage level of the data line associated with that EL unit and maintains the data voltage until the row is selected again during the time the select line is selected during the next image frame. The storage capacitor 186 is connected to the gate of the second transistor 182, which serves as a power transistor so that the voltage level held on the storage capacitor 186 regulates the current flow through the second transistor 182 to the organic light-emitting diode 164 and thereby controls the light output of the EL units 124. The EL unit is then un-selected by applying a voltage signal to the select line 170, which turns off the select transistor.

To illuminate the top EL unit 126, the drive voltage that is intended for the top EL unit 126 is provided on the data line 168. A voltage signal is applied to the second select line 172 that turns on the third transistor 180. The light output level for the EL unit 126 is controlled by a voltage signal, which has been set on the data line 168. The second storage capacitor 188 is then charged to the voltage level of the data line associated with that EL unit and maintains the data voltage until the row is selected again during the time the select line is selected during the next image frame. The second storage capacitor 188 is connected to the gate of the fourth transistor 184, which serves as a power transistor so that the voltage level held on the second storage capacitor 188 regulates the current flow through the fourth transistor 184 to the organic light-emitting diode 166 and thereby controls the light output of the second EL unit 126. The EL unit is then un-selected by applying a voltage signal to the second select line 172, which turns off the second select transistor 180. In an alternative embodiment, separate data lines are employed and connected to transistors 178 and 180 while a common select line is connected to 170 and 172. In this embodiment, both capacitors 186 and 188 may be charged simultaneously, doubling the refresh rate for the device at the cost of additional data driver circuitry.

When this circuit is implemented within a pixilated display device, each light-emitting element in the display device will be activated using this approach. This is typically done starting with light-emitting elements in the first row of the device and progressing down the display, selecting one row at a time. Within the display device, all light-emitting elements in a row, typically corresponding with the direction of the select lines 170 and 172 are updated. The next row of the light-emitting elements within the display device is selected and light-emitting elements within that row are updated. This process is repeated for the entire display, lighting the bottom EL unit 124 within the entire display to the desired luminance, followed by illuminating the top EL unit 126 within each row to the desired luminance. Once the data is refreshed in each EL unit within a light-emitting element, the EL units maintain their desired luminance until updated on the next refresh cycle.

In accordance with the invention, one of the two EL unit emits light primarily in only two of the red, green and blue portions of the visible spectrum, and the other of the two EL unit emits light at least in the third portion of the visible spectrum, and the means for selectively filtering the light produced by the first EL unit filters light from one of the only two of the red, green and blue portions of the visible spectrum in some light-emitting elements and filters light from the other of the only two of the red, green and blue portions of the visible spectrum in some other light-emitting elements. While it is possible to form several full-color display device configurations employing two, stacked, independently addressable emissive EL units meeting such requirements together with color filters, one particularly desirable display configuration consists of a green emissive layer that is placed in a microcavity formed between one pair of electrodes coupled with a magenta emissive layer between another pair of electrodes and an array of broadband yellow and cyan filters. Referring to FIG. 3, in a bottom-emitting configuration the green light-emitting layer may be employed in the top EL unit 126. To construct a uniform microcavity across the entire EL unit, the third electrode 122 will be reflective and the second electrode 112 will be semi-transparent and semi-reflective. This microcavity is used solely to narrow the wavelength band and enhance the efficiency of the on-axis green emission. In this embodiment the microcavity will not typically be used as a selective color filter. However, it is possible to do so in order to facilitate more efficient light extraction through the color filters. Light-emitting materials that produce a peak emission in both the blue and red portion of the spectrum, thereby creating a magenta emission, may be employed in the bottom EL unit 124.

Figure 5:
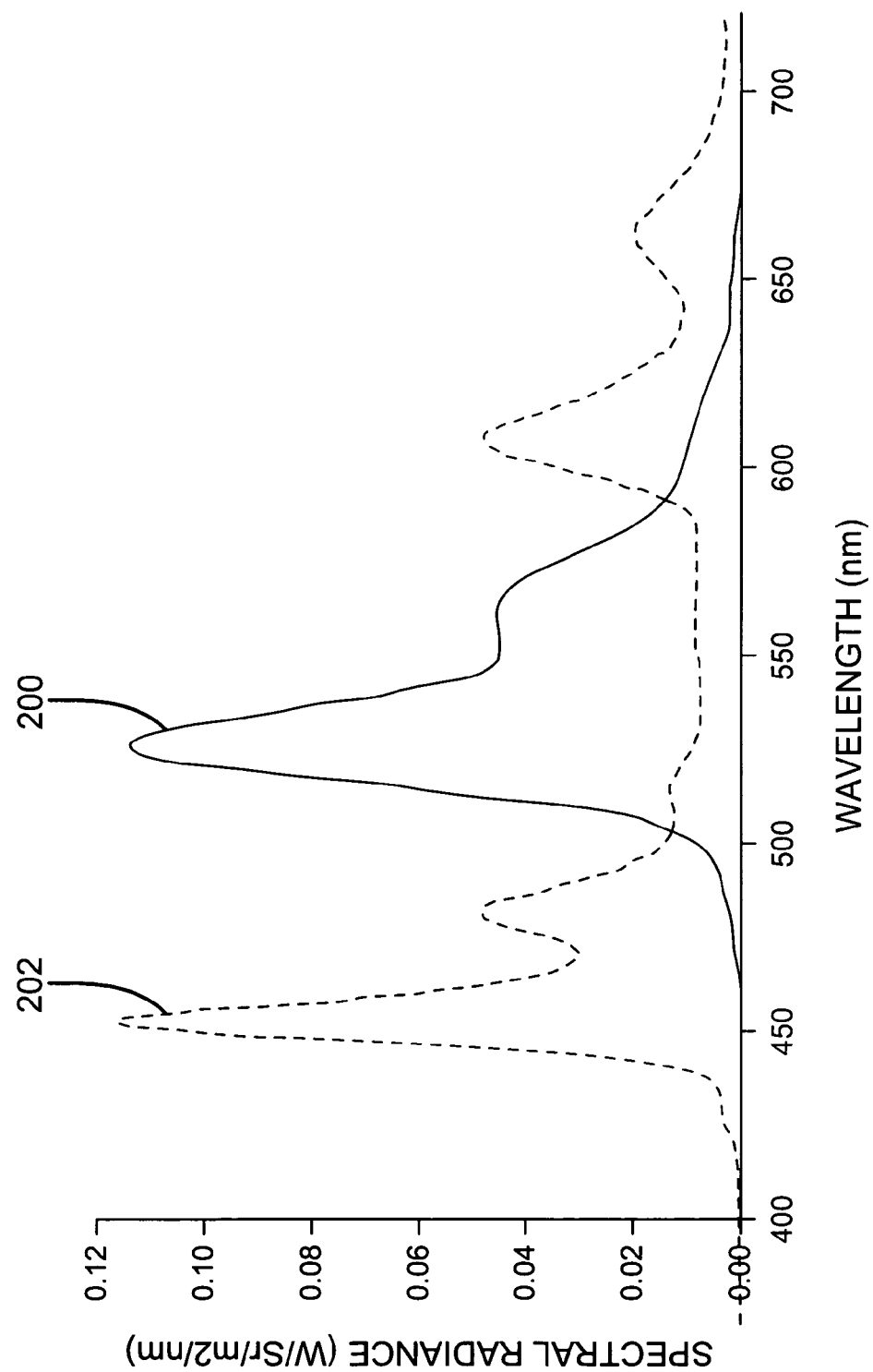
FIG. 5 is a graph of the spectrum for two EL units useful in practicing the present invention.

FIG. 5 shows emission spectra 200 for a green EL unit in a microcavity. Also shown is the emission spectra 202 for a two-peaked, magenta EL unit. As shown here, the emission spectra of the green EL unit 200 has a single, sharp peak near 530 nm, which is near the center of the visible spectrum. The emission spectrum of the magenta EL unit 202 has two sharp peaks. The first peak has a short wavelength emission in the visible spectrum, having a peak near 450 nm. Narrow-band light emission at short wavelengths, such as is present within this single peak, will generally be perceived as blue in color. The second peak has a long wavelength emission within the visible spectrum, having a peak near 610 nm. Narrow-band light emission at long wavelengths, such as is present within this single peak, will generally be perceived as red in color. An emitter having both a short and a long wavelength emission will generally be perceived as magenta in color.

Figure 6:
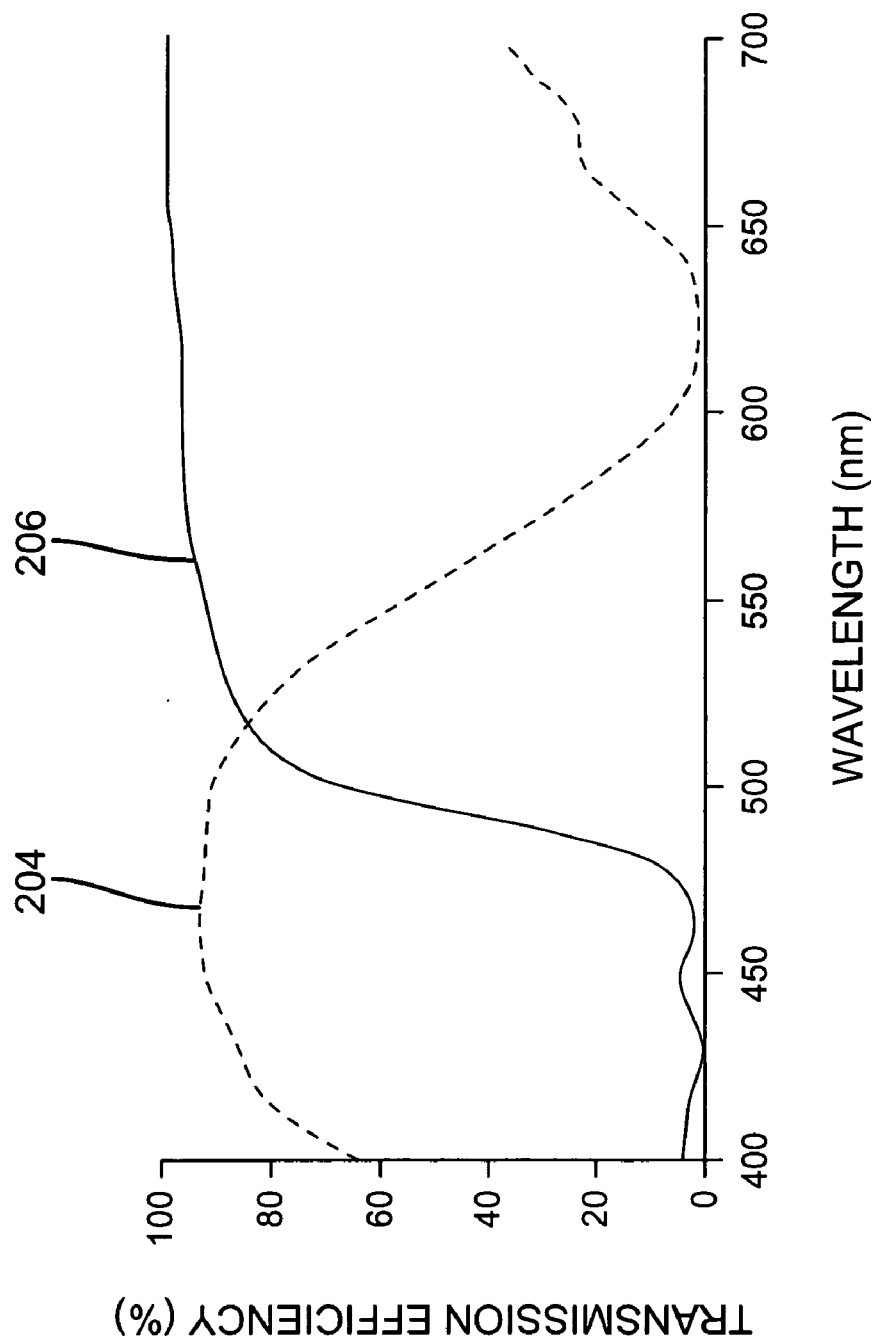
FIG. 6 is a graph of the spectrum of two transmissive color filters useful in practicing the present invention.

FIG. 6 shows the transmission spectra (204 and 206) of two transmissive color filters useful within this display configuration. The filter transmission spectra 204 and 206 will be designed such that one filter transmits the energy from the short wavelength peak within the magenta emission spectrum 202 as well as the green emission peak from the green emission spectrum 200. This filter having the transmission spectrum 204 will be referred to as the cyan filter. Any light-emitting element that has a cyan filter may then emit blue light when the bottom EL unit 124 is active and/or green light when the top EL unit 126 is active. A second filter will be utilized within this display configuration that transmits the energy from the long wavelength peak within the magenta emission spectrum 202 as well as the green energy from the green emission spectrum 200. This filter having transmission spectrum 206 will be referred to as the yellow filter. Any light-emitting element that has a yellow filter may then emit red light when the bottom EL unit 124 is active and/or green light when the top EL unit 126 is active.

Figure 7:
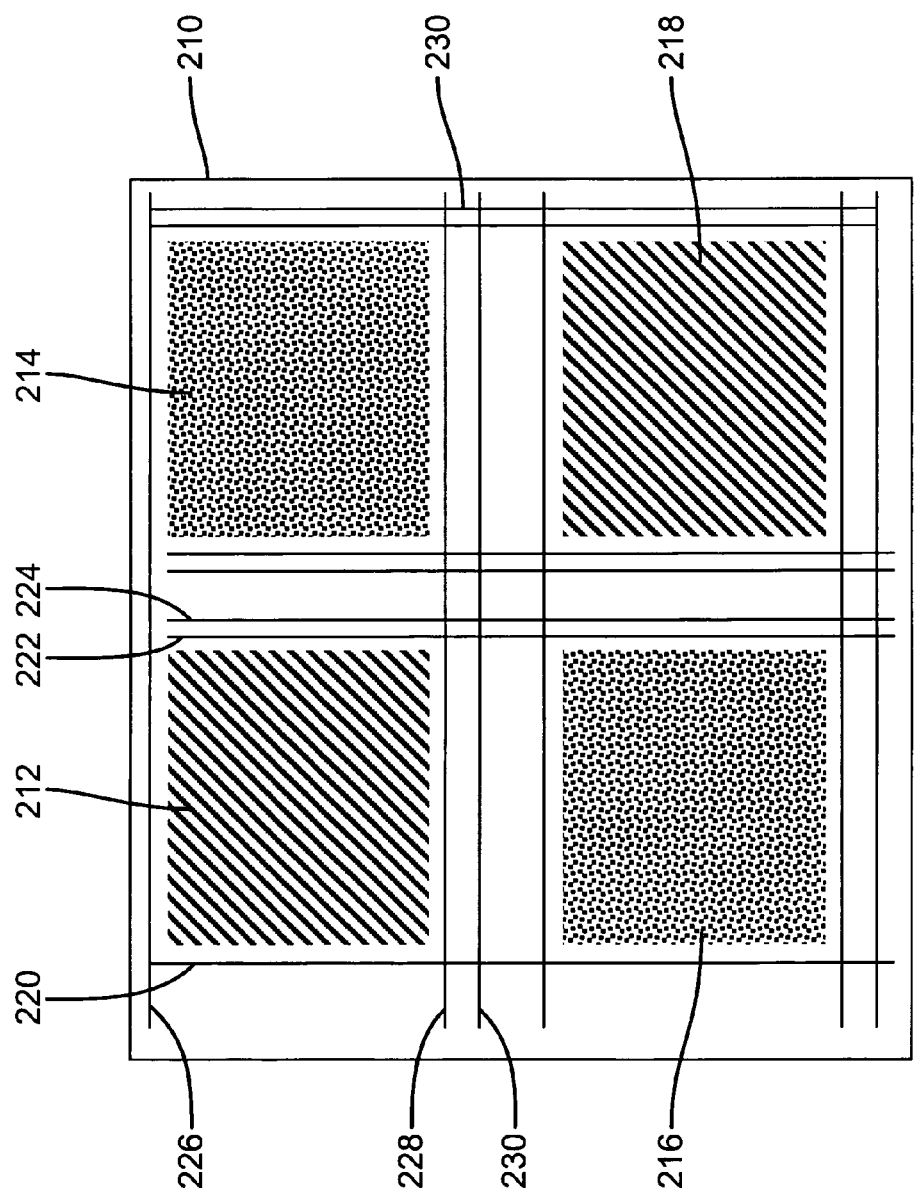
FIG. 7 is a top view of a portion of a display device of the present invention.

Although the light-emitting elements and color filters may be arranged into any number of potential arrangements, one particularly useful display configuration consists of red, green, and blue EL units as shown in FIG. 7. FIG. 7 depicts a portion of a display device 210, comprised of four light-emitting elements (212, 214, 216, and 218) within the display device as viewed from above. Each light-emitting element in this display device contains both a bottom 124 and a top 126 EL unit. Each light-emitting element will typically have two power lines 220 and 224, at least one data line 222, two select lines 226 and 228 and at least one capacitor line 230 as are necessary to drive the circuit depicted in FIG. 4. Within the display device shown in FIG. 7, the second 214 and third 216 light-emitting elements shown consist of a bottom 124 and top 126 EL unit that emit green and magenta light, each of which are filtered by a cyan color filter having a transmission spectrum 204 similar to the one discussed previously. As such, when the bottom EL unit 124 is activated, the cyan filter filters the magenta emission produced by the EL unit 124, allowing only blue light to be emitted by light-emitting elements 214 and 216. When the top EL unit 126 is activated within light-emitting elements 214 and 216 the green emission produced is filtered by the cyan filter, allowing green light to pass. When both the bottom EL unit 124 and the top EL unit 126 are employed together within light-emitting elements 214 and 216, the emissions produced are both filtered by the cyan filter, allowing a combination of blue and green light to pass. As such, light-emitting elements 214 and 216 may each produce blue and/or green light.

The first 212 and fourth 218 light-emitting elements shown also consist of a bottom EL unit 124 that emits magenta light and a top EL unit 126 that emits green light. However, these light-emitting elements are filtered by the yellow color filter, rather than the cyan color filter that is patterned over the second 214 and third 216 light-emitting elements. As such, when the bottom EL unit 124 is activated within the first 212 or fourth 218 light-emitting elements, the yellow filter filters the magenta emission, allowing only red light to be emitted by pixels 212 and 218. When the top EL unit 126 is activated within light-emitting elements 212 and 218 the green emission produced is filtered by the yellow filter, allowing green light to pass. When both the bottom EL unit 124 and the top EL unit 126 are employed together within light-emitting elements 212 and 218, the emissions produced are both filtered by the yellow filter, allowing a combination of red and green light to pass. Therefore, light-emitting elements 214 and 216 may each produce red and/or green light.

In such a device, the array of top EL units 126 produce green light while the array of first bottom EL units 124 produce either red or blue light. As such, the display device may produce the three primary colors necessary to provide a full-color display device. Further, such a display device takes advantage of the fact that the resolution of the human eye for the high-luminous green channel is higher than the resolution of the human eye for the lower-luminous red and blue channels within the display device, providing more green light-emitting elements than red or blue. Constructing the display device in this way allows a high-quality image to be presented to the observer with a minimal number of light-emitting elements. It has been demonstrated by the authors that as long as the angle subtended by each light-emitting element is less than one minute of arc at the user's eye, a display device having this configuration will be perceived to have as high a quality as a display device having a single plane of EL units with three times as many light-emitting elements as are required for the display that has been described. If the light-emitting elements are large enough to subtend more than one minute of arc when arranged as a series of squares as shown in FIG. 7, artifacts may be eliminated by elongating the light-emitting elements in one direction and increasing the number of light-emitting elements in the orthogonal direction to reduce the angle subtended by the light-emitting element in at least one direction; this will generally eliminate the artifact.

Since every light-emitting element will emit green and only every other light-emitting element will emit blue or red and since the magenta emission is more heavily filtered than the green light emission, one would expect the magenta emitter to require higher average current densities than is required to drive the green emitter. Since higher current densities typically result in shorter device lifetimes, one can expect the magenta emitter to have a shorter lifetime than the green emitter. For this reason, it is highly desirable that the magenta emitter be formed using a tandem emitter, such as described in US 2003/0170491 and US 2003/0189401 referenced above, which will lower the current density required to produce the same light output and extend the lifetime of the magenta emitter. Generally, 2 or 3 tandem layers will be required to balance the lifetime of the magenta and green emitting layers. It should further be noted that using the approach as described to construct a display device, the efficiency of the display device will generally be improved over other full-color OLED display devices employing a non-patterned emissive layer. To produce a full-color OLED display device employing a single-layer white emitter with red, green and blue color filters, the color filters will generally filter two-thirds of the emitted radiant energy. Therefore, the final display device emits only about one third of the energy that would have been emitted if the color filters were not present. However, when implementing the display device described here, about 90 percent of the energy that is produced by the green EL unit passes through the color filters and about 45 percent of the energy that is produced by the magenta EL unit passes through the color filters. It may be expected then that nearly two-thirds of the light that is created will pass through the color filters. Therefore, a display device that is constructed in this way does not require the EL materials to be patterned but provides a significant efficiency improvement over the device having a single-layer white emitter with red, green, and blue color filters. It is expected that the efficiency of such a display device will rival the efficiency of a display constructed using a single white emission layer with red, green, blue, and white color filters. That is on the order of 60% of the light output that is generated within the device will be emitted through the color filters. However, at high resolutions, the display device of the present invention may be perceived to be higher in quality while having one fourth the light-emitting elements as the display having red, green, blue and white color filters. Further, it is possible to further improve the efficiency of the display device by employing some light-emitting elements that do not have color filters.

Figure 8:
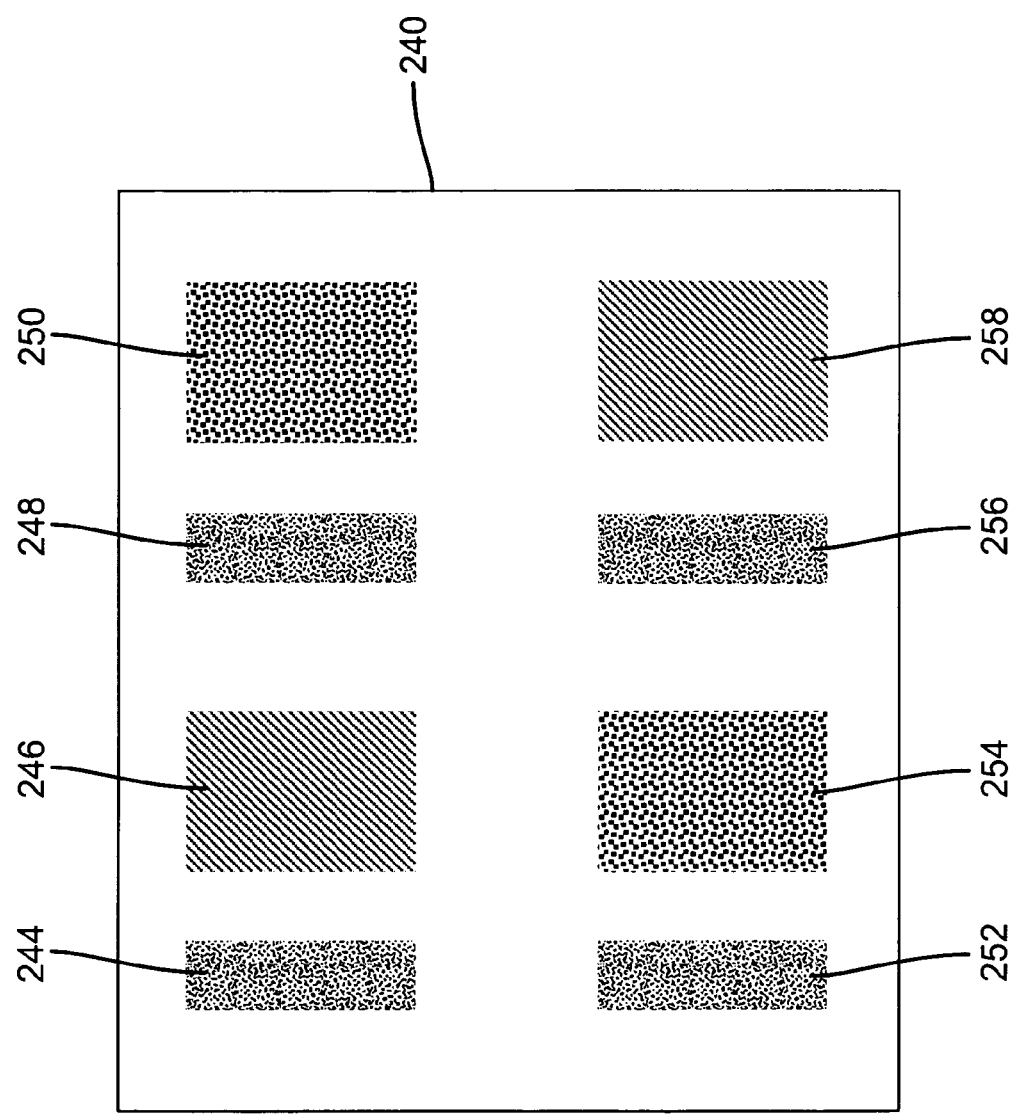
FIG. 8 depicts an arrangement of light-emitting elements useful in practicing an embodiment of the present invention.

FIG. 8 depicts a display device 240 having an alternate arrangement of light-emitting elements in which only some of the light-emitting elements are patterned with a color filter. As shown in FIG. 8, light-emitting elements 250 and 254 are patterned to include a cyan filter. As described earlier, the cyan filter on these light-emitting elements allow the light-emitting elements to produce blue and/or green light. Light-emitting elements 246 and 258 each have a yellow filter. As described earlier, the yellow filter on these light-emitting elements allow the light-emitting elements to produce red and/or green light. The remaining light-emitting elements 244, 248, 252 and 256 do not have a color filter and therefore may produce green and/or magenta light. It should be noted, however that since these light-emitting elements do not have a color filter, their light output is not attenuated by the color filters. Further, since the combination of green and magenta light results in light that is substantially white and since many display applications require the display of neutral or near-neutral colors much more frequently than saturated colors, much of the light that is produced by the display device can be produced without the use of color filters. Therefore, this display configuration results in further gains in efficiency over the display device described in FIG. 7. It should be noted that within this configuration, it is desirable that a line drawn within CIE chromaticity space such that it connects the CIE coordinates of the green and magenta emitter pass as near the white point of the display as possible to facilitate maximum display efficiency. Modeling and calculations performed by the inventors has shown that devices constructed with such a pixel layout will allow about 80% of the energy that is generated before the color filters are applied to be emitted from a display using this configuration.

Figure 9:
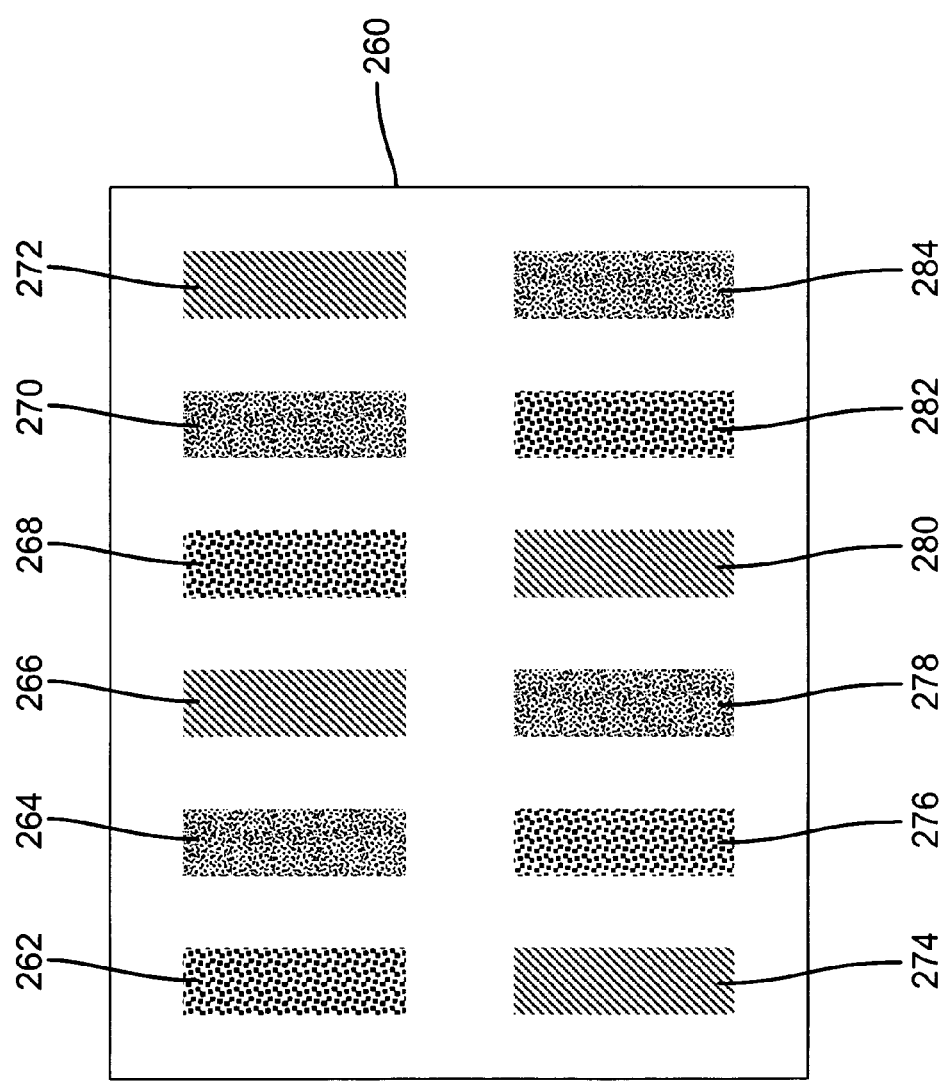
FIG. 9 is a depiction of an arrangement of light-emitting elements useful in practicing an embodiment of the present invention.

Yet another alternative display configuration is depicted in FIG. 9. As shown, the display device 260 is formed from an array of light-emitting elements. However, this display configuration has an equal number of light-emitting elements with cyan, yellow and no color filter. As depicted here, light-emitting elements 262, 268, 276, and 282 are patterned with cyan color filters while light-emitting elements 264, 270, 278, and 284 have no color filters and light-emitting elements 266, 272, 274, and 280 are patterned with yellow color filters. It should be noted that while the light-emitting elements are depicted in FIG. 9 as all having the same area, generally the light-emitting elements will vary in width to maximize their lifetime. Within a configuration as shown here, the width and therefore the area of the light-emitting elements having a cyan or a yellow filter will generally be less than the width of the light-emitting elements without a color filter due to the fact that the unfiltered light-emitting elements will generally be used to produce neutral and near-neutral colors and therefore will be used with a higher frequency than the filtered light-emitting elements. The light-emitting elements having a color filter may be arranged in columns or offset. It should be noted that while offset patterns of elements having a particular color filter such as the one shown in FIG. 9 often are avoided for many applications due to the visibility of jagged edges on vertical lines, including text, this artifact may not be as visible within the display configuration shown here due to the fact that the visibility of jagged edges is highly dependent upon the luminance contrast of the edge and the location of the green light-emitting elements. Since all the light-emitting elements are capable of emitting green light, the green light-emitting elements remain aligned vertically as shown in FIG. 9, despite the non-alignment of the color filters. As the green light-emitting elements provide most of the luminance information, jagged edges can be avoided by utilizing the green light-emitting elements that are aligned in the vertical direction to form vertical lines.

Figure 10:
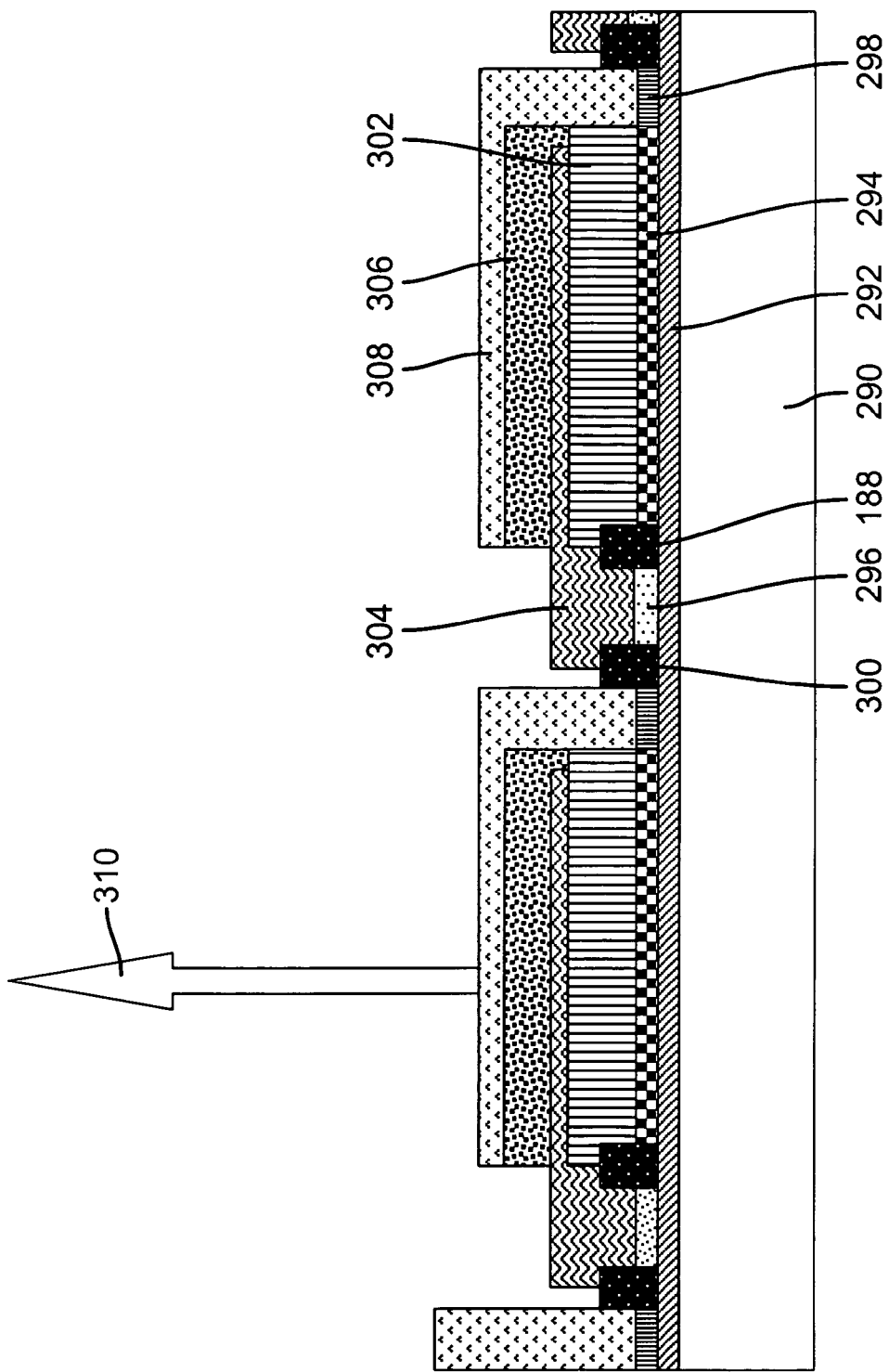
FIG. 10 is a longitudinal cross section of a top-emitting display device of the present invention.

While the display device has been shown in FIG. 3 as a bottom-emitting OLED device that employs transmissive color filters, the present invention is not limited to this embodiment. In fact, top-emitting OLED device structures may also be formed and it is possible to perform the color filtering necessary to selectively create two emissive colors from a single EL unit using other approaches. For example, the device shown in FIG. 10 is a top-emitting OLED device that employs microcavities to selectively produce red or blue emission from a magenta light-emitting EL unit. Within this display device, light emission 310 occurs through the top of the display device and is not transmitted through the substrate.

As shown in FIG. 10, the display device is formed on a substrate 290. On this substrate 290 a layer 292 will be formed that contains thin-film transistors and other drive circuitry to drive the device as is known in the art. Over this drive circuitry, dielectric materials 300 will be formed to insulate the electrodes from each other. A first reflective electrode 294 will be patterned together with first 296 and second 298 connectors for the second 304 and third 308 electrodes. A bottom EL unit 302 will be formed on the top of the first electrode 294. A second electrode 304 that is semi-transparent will be connected to the first connector 296 and formed over the bottom EL unit 302. A top EL unit 306 will be formed over the second electrode 304. Finally, the substantially transparent third electrode 308 will be patterned over the top EL unit 304 such that a connection is made to the second connector 298.

Within this embodiment, the bottom EL unit 302 preferably provides emission of the magenta light as described earlier while the top EL unit 306 provides green light. While color filters might be placed above the third electrode 308 to filter the light emission as in the previous embodiment, in this alternative embodiment, at least two separate microcavities are formed within the bottom EL unit 302 by spacing the light emission layer within the bottom EL unit 302 differently within different light-emitting elements. This is done by optimizing the microcavity to provide blue emission for some light-emitting elements and red emission for other light-emitting elements. By forming the bottom EL unit such that some light-emitting elements have microcavities that are tuned to emit either red or blue light, a display device may be constructed to have light-emitting elements that emit either red and green or blue and green light similarly to the light that is produced by the device depicted in FIG. 7. However, this display configuration has the additional advantage that transmission color filters are not required. Therefore, the emission from the green layer is filtered by an inconsequential amount. Further, the emission from the first EL unit 302 is produced by a microcavity creating very narrowband and therefore very pure red and blue emission. Overall, this device may be expected to have an efficiency that rivals the efficiency of a device that does not employ color filters.

The specific embodiments discussed thus far rely on separate EL units providing magenta emission and providing green emission together with color filtering means. However, it is possible to produce other full-color display devices having two unpatterned layers of EL materials together with color filters. In fact, such a display device may be formed as long as at least one of the of EL units emit light in at least two of the red, green, or blue portions of the visible spectrum and a color filter may be employed with at least some light-emitting elements in order to selectively filter the light from the this EL material to form two separate display primaries. For this reason, other display devices may be formed using EL units that produce other colors of light that are combined with other color filters. Among the combinations that may be employed are a display device having two EL units, one emitting yellow and one emitting cyan light in combination with an array of green and magenta color filters; a display device having two EL units, one emitting yellow light and one emitting blue light in combination with an array of green and red color filters; and a display device having two EL units, one emitting cyan light and one emitting red light in combination with an array of green and blue color filters.

It should be noted, however, that to form display devices having higher perceived resolution, it is desired to form more EL units that result in a light emission that is high in luminance than the EL units that result in a light emission that is low in luminance. Further, to produce a display device that is high in luminance efficiency, any reduction in luminance efficiency that results from color filtering should be minimized.

Another embodiment may therefore be further illustrated by describing a display device having a bottom EL unit 124 that emits light that is substantially yellow in color and a top EL unit 126 that emits light that is substantially cyan in color. In such a display device, an array of color filters are then formed such that some light-emitting elements allow green light to pass while other light-emitting elements have a filter that allows both red and blue light to pass while filtering the green light. In such a display device, the light-emitting elements with a green filter may emit two slightly different colors of green when the bottom 124 or top 126 EL units are activated. The light-emitting elements having the filter that allows red or blue light to pass will emit red light when the EL unit having the yellow emitter is activated and will emit blue light when the EL unit having the cyan emitter is activated. As described in the earlier embodiment, it is once again not necessary that every light-emitting element contain a color filter and removing the color filter from some light-emitting elements allows the cyan and yellow light emission to be combined to produce emission that may appear substantially white in color.

Figure 11:
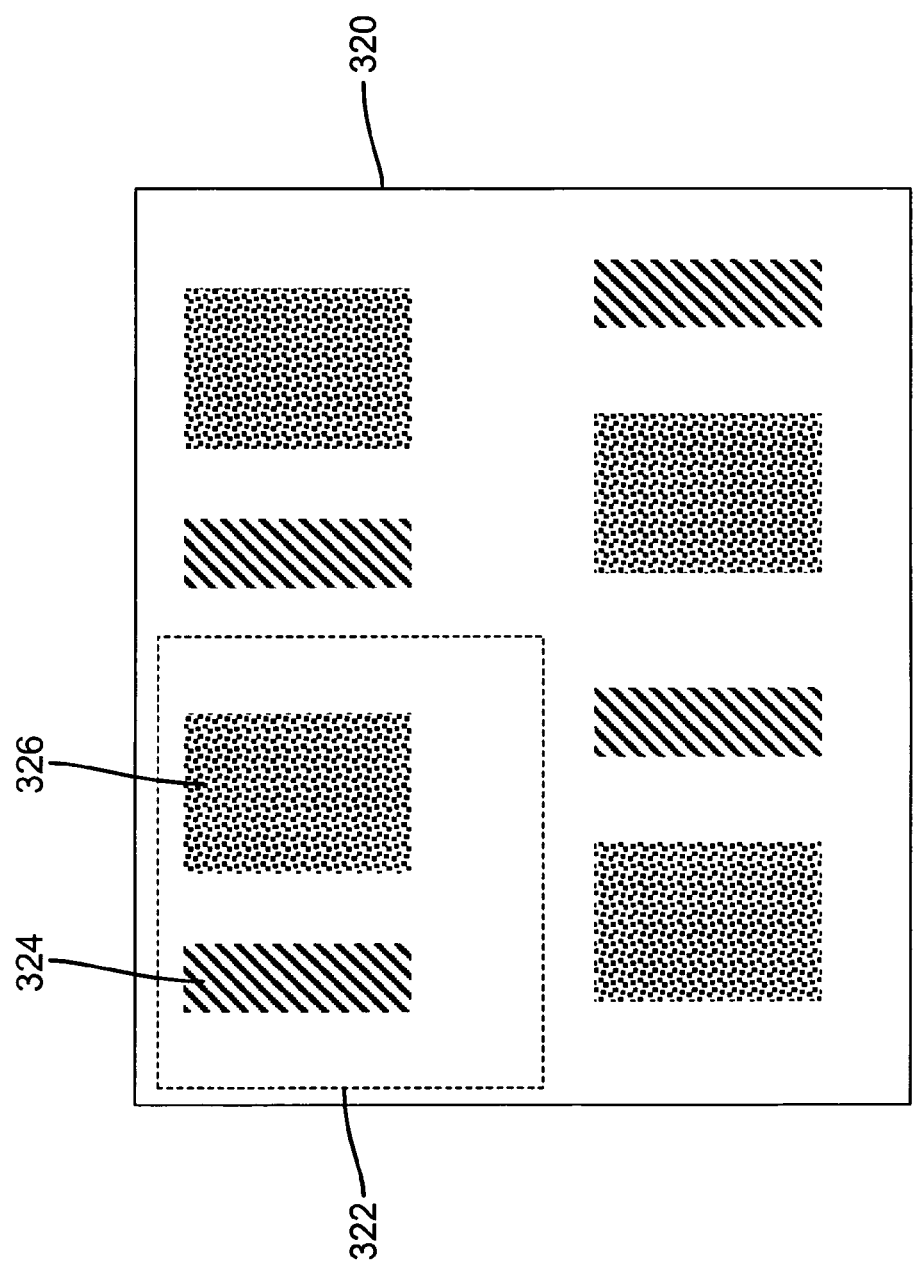
FIG. 11 is a depiction of an arrangement of light-emitting elements useful in practicing an embodiment of the present invention.

A display device 320 formed using color filters in this way is depicted in FIG. 11. As shown in this figure, the display device 320 is formed from an array of pixels 322. Each pixel contains a light-emitting element with a green color filter 324 and a light-emitting element containing a magenta color filter 326. Assuming that the materials used to produce yellow light are used to form the bottom EL unit 124 and the materials used to produce cyan light are used to form the top EL unit 126, the display device will produce red light when the bottom EL unit 124 is activated under the magenta color filter 326, blue light will be produced when the top EL unit 126 is activated under the magenta color filter 326 and green light will be produced when either the bottom 124 or top 126 EL unit is activated under the green color filter 324. In this way, the display device is capable of providing selectable red, green, and blue primaries without patterning of the emissive materials and performs this function within a 2-layer device. It should be noted that the area of the green filtered 324 light-emitting element will often be smaller than the magenta filtered 326 light-emitting element. Each EL unit within the green filtered 324 light-emitting element produces green light and could be driven with a lower average current density than the EL units within the magenta filtered 326 light-emitting element. It will be recognized, however, that each of the primaries is filtered and the power efficiency of the display device will be reduced by the color filters.

Figure 12:
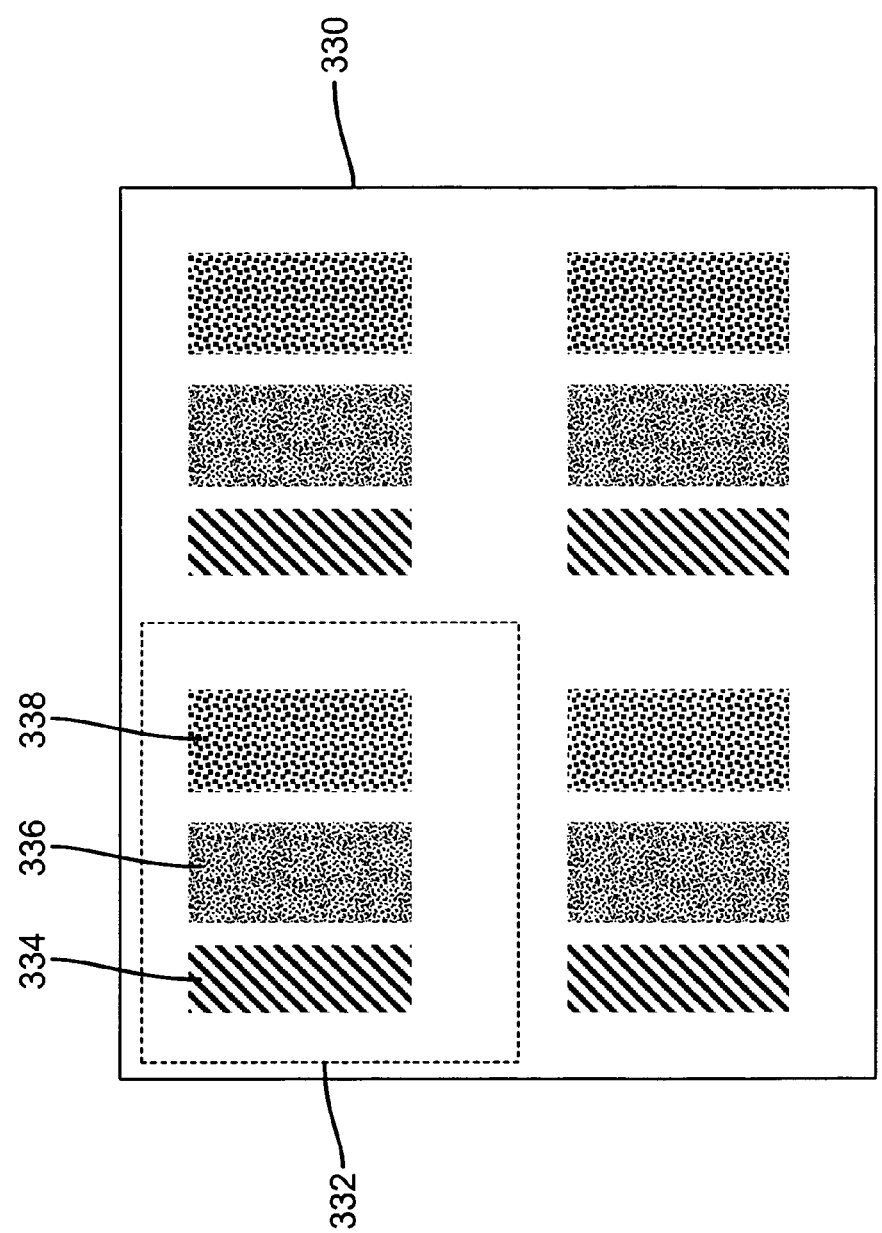
FIG. 12 is a depiction of an arrangement of light-emitting elements useful in practicing an embodiment of the present invention.

The power efficiency of the display device shown in FIG. 11 may be improved using the display as depicted in FIG. 12. FIG. 12 shows a portion of a display device 330 that is formed from an array of pixels 332. Each pixel consists of an element having a green color filter 334, a light-emitting element having no color filter 336, and a light-emitting element having a magenta color filter 338. Red, green and blue light are produced by the same means as described before. That is, one EL unit in the display device produces cyan light and one produces yellow light. The green display primary is then formed when either the cyan or yellow light producing EL units are filtered by the green color filter 334. The red display primary is formed when light produced by the yellow light producing EL unit is filtered by the magenta color filter 338 and the blue display primary is formed when light produced by the cyan light producing EL unit is filtered by the magenta color filter. However, the remaining light-emitting element has no color filter 336. As such, this light-emitting element produces yellow light and/or cyan light depending upon which EL unit is activated. Therefore the display device is capable of rendering a total of six individual color primaries, including red, blue, cyan, yellow and two independent greens. To produce the most power efficient display device, the position of the yellow and cyan will be selected such that a color very near the white point of the display device can be made from these two primaries and ideally the white point of the display device will lie within a triangle drawn through the CIE chromaticity coordinates of the colors produced by the yellow and cyan primaries and the next most efficient color primary, which will typically be one of the green primaries. To optimize the lifetime of the display device, the light-emitting elements in the display device will be of unequal size. To optimize lifetime, the light-emitting element that has no color filter 336 will typically be the largest of the light-emitting elements since it will be used to produce the near neutral colors and the light-emitting element that has a green color filter 334 will typically be the smallest of the remaining light-emitting elements.

To drive either the display device depicted in FIGS. 8, 9, or 12, a color conversion method is necessary to convert from the typical three-color input signal to the four or more color signal necessary to drive the display devices depicted in these figures. A method suited for transforming an incoming three-color to a four-or-more color signal is provided in FIG. 13 and FIG. 14 and described here. To perform this process, the CIE chromaticity coordinates are input 342 for each primary. Inverse phosphor matrices are then calculated 344 for all subgamuts to be used in the color conversion where a subgamut is defined as any combination of three primaries. The primaries are then arranged 346 from the one with the shortest wavelength energy to the one with the longest wavelength energy. This may be accomplished using the CIE chromaticity coordinates for each primary, such that the primaries are arranged to follow the border of the chromaticity diagram from blue to red and back to blue again. All of the subgamuts that may be formed from neighboring sets of three primaries are then determined 348. Each of these subgamuts will then be defined by three primaries with a center primary from the arranged list created in step 346 and two neighboring primaries at the extremes or ends of the triangle used to form the subgamut. As an example, we will assume a display device having the six primaries as the device shown in FIG. 12. For such a device the primaries would be arranged in a list progressing in the order blue, cyan, a first green, a second green, yellow and red. In such a device a first subgamut triangle may be formed from blue, cyan and a first green primary and would have the cyan primary as the center primary and the blue and the first green primary as the neighboring end primaries. A second subgamut would be defined with a first green primary as the center primary and the cyan and second green primaries as the neighboring end primaries. A third subgamut would be defined with the second green primary as the center primary and the first green and yellow primary as the neighboring end primaries. A fourth subgamut would be defined with the yellow primary as the center primary and the second green and red primaries as the neighboring end primaries. The final subgamut that can be created from neighboring primaries would be formed with the red primary as the center primary and the yellow and blue primaries as the neighboring end primaries.

For each of the subgamuts determined in step 348, the theoretical intensities for forming each primary that is not in each subgamut are calculated 350. While it is not physically possible to form these colors using these subgamuts, this calculation is useful as the ratios of the intensities for the outside primaries in the gamut define a line that segments subgamuts within the color space. The ratio of the theoretical intensities of the two primaries that are at the ends of the current subgamut used to form each primary outside the current subgamut is then calculated 352. All other subgamuts are then determined 354 by forming subgamuts where first one and if possible more primaries in the ordered list are left out of the list as one progresses through the list, keeping in mind that to form a subgamut requires three primaries. As it will be possible to form each color using multiple subgamuts, other input selection criteria may be input 356 which can be used to define the decision rules around the default rendering values and the m alternative sets of rendering values. Finally, a set of decision rules is determined 358. The decision rules are formed knowing that any color that has positive intensities when formed from one of the subgamuts determined in step 348 will lie within that subgamut. Any color that has negative values will lie outside the subgamut. However, any color having a ratio that is larger than the ratio determined in step 352 will lie to the same side of a line as the end primary that is used in the numerator of the ratio calculation where the line intercepts the center primary and the corresponding primary from outside of the subgamut. These decision rules will also consider other information such as the preferred set of primaries to render the preferred color. Other information such as power consumption or lifetime of the primaries, or predictions of overall image quality to help provide a selection of a default combination of subgamuts, as well as one or more alternative combination of subgamuts to be employed in rendering may also be considered when forming the final decision rules.

Based upon this information, a set of logic may be formed that indicates all possible home subgamuts for any input color which may be defined from a set of n primaries by calculating n−2 sets of intensity values and n/2 comparisons as opposed to calculating the intensities for all n!/(3!*(n−3)! combinations of the n primaries. Steps 342 through steps 358 are dependent upon the chromaticity coordinates of the primaries and for this reason, must only be performed once. These steps may be performed at device startup but may also be performed once during manufacturing or initial startup of the display device and the resulting decision rules stored in memory, allowing each of the following steps to be performed without further delay.

Figure 14:
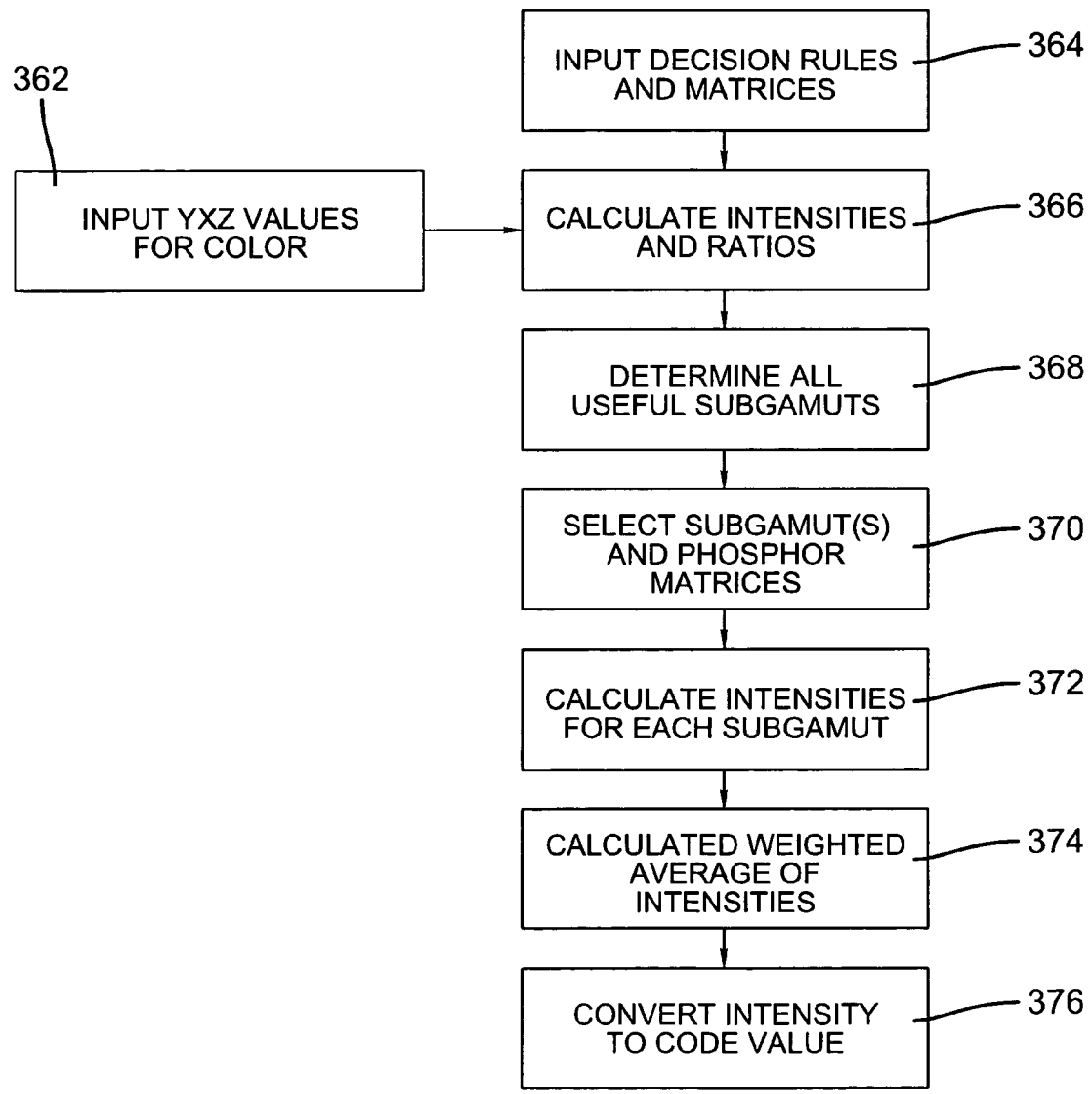
FIG. 14 is a flow chart showing a method for transforming three-color input values to values suitable for use on a four-or-more color display device.

FIG. 14 shows a method for applying the input image conversion from a three-color signal to a four-or-more color signal. To apply this method, the XYZ values for each incoming code value are input 362.

Figure 13:
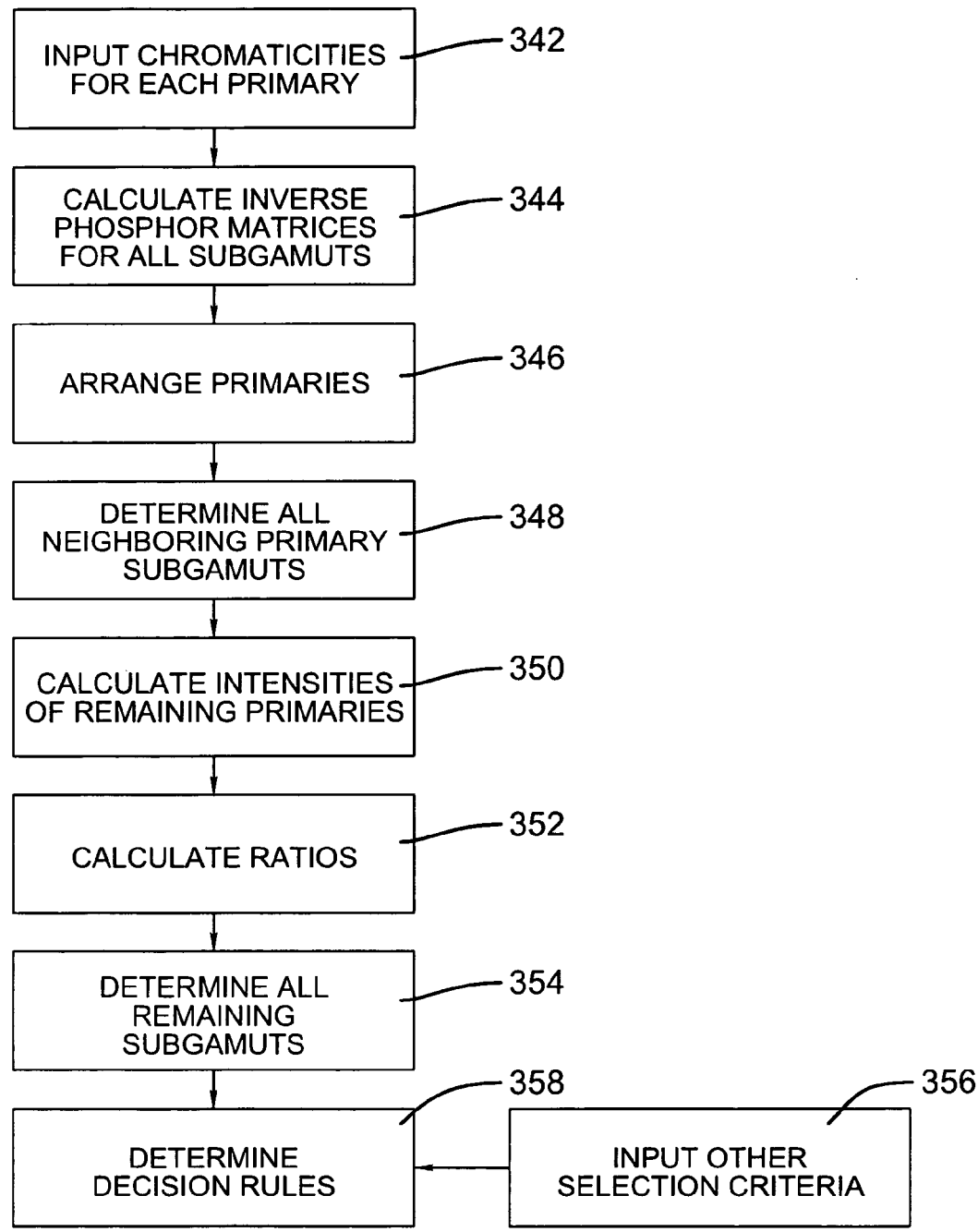
FIG. 13 is a flow chart showing a method for determining decision rules for performing color conversion from three to four or more colors.

Next the decision rules and 3×3 phosphor matrices determined using the method shown in FIG. 13 are input 364. The intensities and ratios for each set of XYZ values are then calculated 366 for each of the non-overlapping and neighboring subgamuts determined in step 348 of FIG. 13. Based upon the decision rules formed in step 358 of FIG. 13, all subgamuts useful in creating the desired color are determined 368. The appropriate subgamut or subgamuts are then selected 370 based on the rendering information for the current of the renderings and the decision rules determined in step 358.

Intensities are then calculated 372 for each subgamut by multiplying the XYZ input values by the inverse phosphor matrices. A weighted average of the intensities are calculated 374. The weightings for this calculation are determined according to the decision rules from step 358 of FIG. 13. Generally, the weightings in this average will be the mixing ratio for each subgamut. This weighted average produces the relative luminance intensity for each primary. These relative luminance intensities are then converted 376 by converting the intensity to a value that is linearly related to the voltage necessary to produce the desired luminance. Through this method, the input three-color signal is converted to any four or more signal that may be used to drive an OLED display of the current invention that provides four or more different color primaries.

By providing the color conversion method as described, a three-color input signal may be converted to a four-or-more color signal for driving display devices such as shown in FIGS. 8, 9, and 12. In this way, five- and six-color display devices may be developed without patterning of EL materials.

In at least some of the device configurations, the data must then be mapped to a mosaic of light-emitting elements in which there is more than one element of one color than another. For example, referring to FIG. 7, each light-emitting element emits green light while every other light-emitting element emits either red or blue light. In such a device, it is desirable that the data that is input to the display device include data for as many pixels as the maximum number of any single colored light-emitting element in the display device. For example, if the display device constructed as shown in FIG. 7 has 640×480 light-emitting elements, all of which may emit green light then the input data will ideally include 640×480 data points. When the display device has more of one color of light-emitting element than another, additional calculations may be performed before step 376 in order to correct the input image data for this display attribute.

Specifically, data values will be calculated to adjust for the fact that there are more data values than light-emitting elements. Using the pixel pattern in FIG. 7 again as an example, data values must be calculated for the blue and red pixel values that take into account the fact that there are only half as many red and blue light-emitting elements as there are blue light-emitting elements. Further, these calculations should be performed to maintain as much of the image information as is possible. Methods for performing these calculations have been discussed in detail within co-pending U.S. Ser. No. 11/048,385 filed Feb. 1, 2005 by Miller et al. entitled "Color display device with enhanced pixel pattern" the disclosure of which is herein incorporated by reference. Using methods such as these, calculations will be performed to determine a weighted average for the data locations for which there are light-emitting elements and the neighboring data locations for which there are not light-emitting elements. In a preferred method, each line or region of data will be convolved with a one or two-dimensional kernel and the resulting values will be subsampled according to the sampling lattice of the light-emitting elements. Continuing using FIG. 7 as an example, the red and blue data values will be convolved with a three-element, one-dimensional filter having the coefficients of 0.25, 0.5, and 0.25. The resulting data will then sampled according to the sampling grid provided by the display device. For FIG. 7, the sampling is performed such that every other red or blue data value is utilized, depending on whether the subpixel for which it is intended emits red or blue light.

Figure 15:
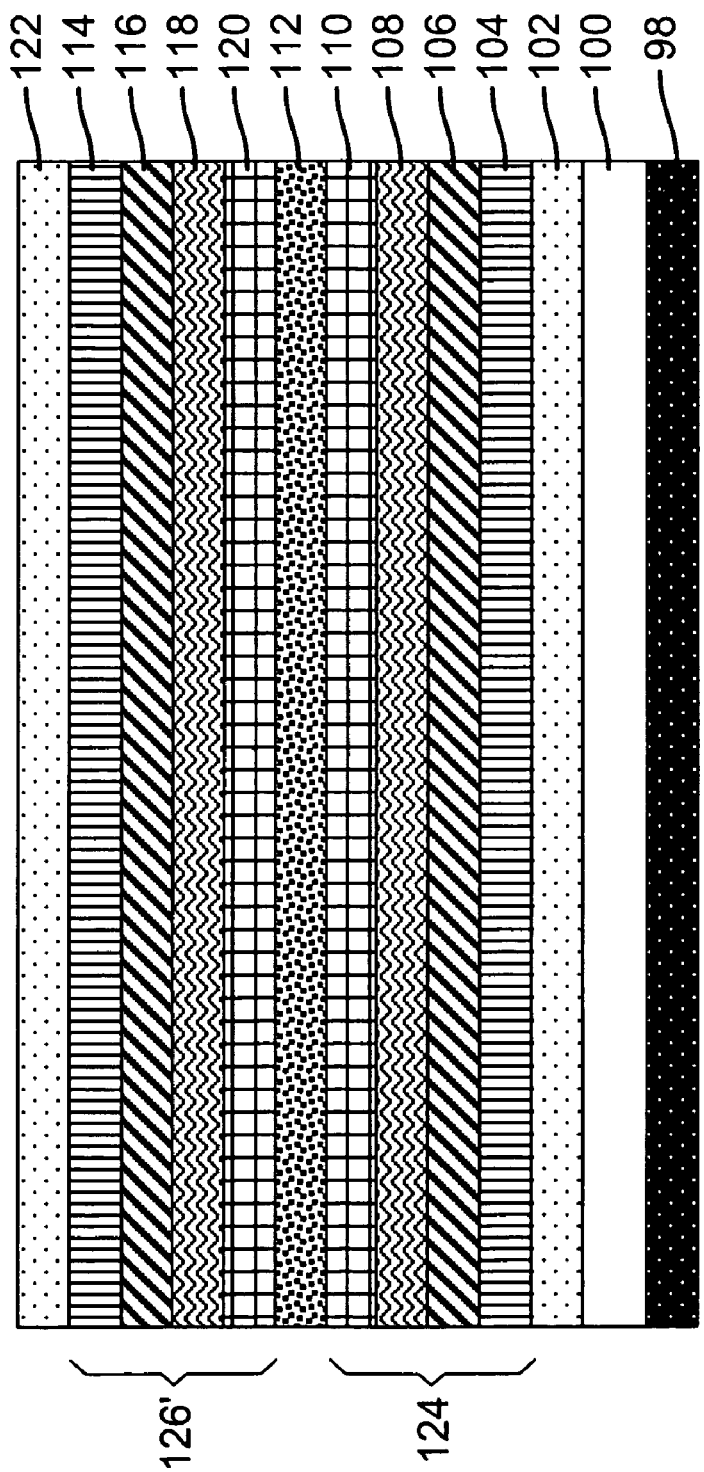
FIG. 15 is a diagram showing a longitudinal cross section of an OLED device of the present invention.

While the first and second EL units may be formed from similar arrangements of organic material layers, these EL units may alternatively be formed in a non-repeating fashion. In another embodiment, the order of the organic layers forming either the first and/or second EL unit may be reversed as shown in FIG. 15. In such an embodiment, the bottom EL unit 124 may be formed similarly as in FIG. 2 consisting of the first optional hole-injecting layer 104 on the first electrode 102, followed by the first hole-transporting layer 106, the first light-emitting layer 108, and the first electron-transporting layer 110. However, the top EL unit 126' is now formed from an inverted layer arrangement in which the second electron-transporting layer 120 is deposited on the second electrode 112, the second light-emitting layer 118 is deposited on the second electron-transporting layer 120, the second hole-transporting layer 116 is deposited on the second light-emitting layer 118 and the second optional hole-injecting layer 114 is deposited on the second electron-transporting layer 116. By forming the device in this way, an electrical potential having the same polarity may be used to drive both the bottom and top EL units within the display device. Such a device structure in which one of the bottom 124 or top 126 EL units are inverted eliminates the need for both positive and negative power lines within the display design as either a negative or positive voltage may then be used to drive both the first and second EL units with a positive bias. This not only simplifies the panel layout by reducing the number of power lines required within an active-matrix display design but simplifies the power supply as it is not necessary to provide both positive and negative voltages to the display panel.

The invention has been described in detail with particular reference to certain preferred embodiments thereof, but it will be understood that variations and modifications can be effected within the spirit and scope of the invention.

PARTS LIST 10 substrate
12 first electrode
14 first EL unit
16 second electrode
18 second EL unit
20 third electrode
22 third EL unit
24 fourth electrode
98 substrate
100 color filter
102 first electrode
104 first optional hole-injecting layer
105 insulating layer
106 first hole-transporting layer
108 first light-emitting layer
110 first electron-transporting layer
112 second electrode
114 second optional hole-injecting layer
116 second hole-transporting layer
118 second light-emitting layer
120 second electron-transporting layer
122 third electrode
124 bottom EL unit
126 top EL unit
126' inverted top EL unit
140 substrate
142 drive circuitry layer
144 first connector
146 color filter
148 color filter
152 planarization layer
154 second connector
158 light emission
160 first sub-circuit
162 second sub-circuit
164 first diode
166 second diode
168 input data line
170 first select line
172 second select line
174 first power line
176 second power line
178 first TFT
180 third TFT
182 second TFT
184 fourth TFT
186 first capacitor
188 second capacitor
200 green emission spectrum
202 magenta emission spectrum
204 cyan filter transmission spectrum
206 yellow filter transmission spectrum
210 display device
212 first light-emitting element
214 second light-emitting element
216 third light-emitting element
218 fourth light-emitting element
220 first power line
222 data line
224 second power line
226 first select line
228 second select line
230 capacitor line
240 display device
244 light-emitting element with no color filter
246 light-emitting element with yellow filter
248 light-emitting element with no color filter
250 light-emitting element with cyan filter
252 light-emitting element with no color filter
254 light-emitting element with cyan filter
256 light-emitting element with no color filter
258 light-emitting element with yellow filter
260 display device
262 light-emitting element with cyan color filter
264 light-emitting element with no color filter
266 light-emitting element with yellow color filter
268 light-emitting element with cyan color filter
270 light-emitting element with no color filter
272 light-emitting element with yellow color filter
274 light-emitting element with yellow color filter
276 light-emitting element with cyan color filter
280 light-emitting element with yellow color filter
278 light-emitting element with no color filter
282 light-emitting element with cyan color filter
284 light-emitting element with no color filter
290 substrate
292 drive circuitry layer
294 first reflective electrode
296 first connector
298 second connector
300 dielectric materials
302 first EL unit
304 second electrode
306 second EL unit
308 third electrode
310 light emission
320 display device
322 first pixel array
324 light-emitting element with green color filter
326 light-emitting element with magenta color filter
330 display device
332 second pixel array
334 light-emitting element with green color filter
336 light-emitting element with no color filter
338 light-emitting element with magenta color filter
342 coordinate input step
344 calculate matrices step
346 primaries arranged step
348 determine subgamuts step
350 calculate intensities step
352 calculate ratio step
354 determine all other subgamuts step
356 input selection criteria step
358 determine decision rules step
362 input XYZ values step
364 input decision rules and matrices step
366 calculate intensities and ratios step
368 determine subgamuts step
370 select appropriate subgamut step
372 calculate intensities step
374 calculate weighted average of the intensities step
376 convert relative luminance intensities step

The invention claimed is:

1. A full-color OLED display device comprising:
 a. a substrate;
 b. an array of light-emitting elements, each element comprising a first EL unit positioned between and in electrical contact with a first pair of electrodes and a second EL unit positioned between and in electrical contact with a second pair of electrodes and located above or below the first EL unit, wherein the first EL unit emits light primarily in only two of the red, green and blue portions of the visible spectrum, and the second EL unit emits light at least in the remaining third portion of the visible spectrum; and c. means for selectively filtering the light produced by the first EL unit to filter light from one of the only two of the red, green and blue portions of the visible spectrum in some light-emitting elements and to filter light from the other of the only two of the red, green and blue portions of the visible spectrum in some other light-emitting elements.

2. The OLED device of claim 1 wherein the means for selectively filtering is provided by an array of at least two different transmissive color filters.

3. The OLED display device of claim 1 wherein the means for selectively filtering is provided through the use of microcavities.

4. The OLED display device of claim 1 wherein the means for selectively filtering the light is not applied to all light-emitting elements within the display device.

5. The OLED device of claim 4 wherein when activated light emitted by the first and second EL units in combination produces a color that is substantially equal to the white point of the display device.

6. The OLED device of claim 4 wherein the area of a light-emitting element which outputs light that is not filtered by the means for selectively filtering is larger than the area of a light-emitting element which outputs light that is filtered by the means for selectively filtering.

7. The OLED device of claim 1 wherein the display device is a passive-matrix display.

8. The OLED device of claim 1 wherein the device is an active-matrix display.

9. The OLED device of claim 1 wherein the second EL unit emits green light, the first EL unit emits magenta light comprised primarily of red and blue portions of the visible spectrum, and the means for selectively filtering allows some light-emitting elements to emit green and red light and some other light-emitting elements to emit green and blue light.

10. The full-color display device of claim 9 wherein the location of the red and blue light-emitting elements are interspersed along a row or column of the display device.

11. The full-color display device of claim 9 wherein the location of the red and blue light-emitting elements are interspersed along both rows and columns of the display device.

12. The OLED device of claim 9 wherein the means for selectively filtering the light is not applied to all light-emitting elements within the display device, and some additional of the light-emitting elements produce green and magenta light.

13. The OLED device of claim 12 wherein the area of the light-emitting elements emitting magenta light is larger than the area of the light-emitting elements emitting red or blue light.

14. The OLED device of claim 9 wherein each of the light-emitting elements emit green light, half of the light-emitting elements emit magenta light, one fourth of the light-emitting elements emit red light and one fourth of the light-emitting elements emit blue light.

15. The OLED device of claim 9 wherein each of the light-emitting elements emit green light, one third of the light-emitting elements emit magenta light, one third of the light-emitting elements emit blue light and one third of the light-emitting elements emit red light.

16. The OLED device of claim 9 wherein the means for selectively filtering includes patterned broadband yellow and broadband cyan color filters.

17. The OLED device of claim 9 wherein each light-emitting element emits green light, a first half of the light-emitting elements emit red light, and a second half of the light-emitting elements emit blue light.

18. The OLED device of claim 1 wherein the second EL unit emits cyan light, the first EL unit emits yellow light comprised primarily of red and green portions of the visible spectrum, and the means for selectively filtering allows some light-emitting elements to emit blue and red light and some other light-emitting elements to emit green light.

19. The OLED device of claim 18 wherein the means for selectively filtering includes a green color filter and a dual peaked magenta color filter.

20. The OLED device of claim 18 wherein the means for selectively filtering the light is not applied to all light-emitting elements within the display device.

21. The OLED device of claim 1, further comprising a controller for applying a three to four or more color conversion to incoming data.

22. The OLED device of claim 1, wherein the first EL unit of each element is positioned between and in electrical contact with first and second electrodes and the second EL unit is positioned between and in electrical contact with the second electrode and a third electrode.

23. The OLED device of claim 22 wherein the second EL unit is formed from an inverted stack of organic material layers relative to the order of organic material layers in the first EL unit.

24. The OLED device of claim 1 wherein the first EL unit emits light that has a first high energy peak in one of the red, green and blue portions of the visible spectrum and a second high energy peak in a second of the red, green and blue portions of the visible spectrum.

25. The OLED display of claim 1 wherein at least one of the first and second EL units is comprised of tandem light-emitting layers.

26. The OLED display of claim 1 wherein the second EL unit is formed in a microcavity.

27. The OLED display of claim 1 wherein the OLED display is a top-emitting OLED display device.

28. The OLED display of claim 1, wherein the OLED display is a bottom-emitting OLED display device.

29. The OLED device of claim 1 further comprising a first circuit for driving the first EL and a second circuit for driving the second EL and wherein the first and second circuits share at least one common signal.

30. The OLED device of claim 1 wherein the common signal is a select signal or a data signal.

* * * * *